(12) United States Patent
Hu et al.

(10) Patent No.: US 9,076,535 B2
(45) Date of Patent: Jul. 7, 2015

(54) ARRAY ARRANGEMENT INCLUDING CARRIER SOURCE

(71) Applicant: MACRONIX INTERNATIONAL CO., LTD., Hsinchu (TW)

(72) Inventors: Chih-Wei Hu, Miaoli (TW); Teng-Hao Yeh, Hsinchu (TW); Yen-Hao Shih, Elmsford, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 129 days.

(21) Appl. No.: 13/936,729

(22) Filed: Jul. 8, 2013

(65) Prior Publication Data

US 2015/0009757 A1    Jan. 8, 2015

(51) Int. Cl.
   G11C 16/04   (2006.01)
   G11C 16/10   (2006.01)

(52) U.S. Cl.
   CPC ............ *G11C 16/10* (2013.01); *G11C 16/0483* (2013.01)

(58) Field of Classification Search
   USPC ................... 365/185.17, 185.05, 185.18, 243
   See application file for complete search history.

(56) References Cited

U.S. PATENT DOCUMENTS

| | | | |
|---|---|---|---|
| 4,881,114 A | 11/1989 | Mohsen et al. | |
| 5,912,489 A | 6/1999 | Chen et al. | |
| 5,991,193 A | 11/1999 | Gallagher et al. | |
| 6,034,882 A | 3/2000 | Johnson et al. | |
| 6,906,361 B2 | 6/2005 | Zhang | |
| 6,906,940 B1 | 6/2005 | Lue | |
| 7,005,350 B2 | 2/2006 | Walker et al. | |
| 7,081,377 B2* | 7/2006 | Cleeves | 438/131 |
| 7,129,538 B2 | 10/2006 | Lee et al. | |
| 7,177,169 B2* | 2/2007 | Scheuerlein | 365/51 |
| 7,274,594 B2 | 9/2007 | Pascucci et al. | |
| 7,315,474 B2 | 1/2008 | Lue | |
| 7,382,647 B1 | 6/2008 | Gopalakrishnan | |
| 7,420,242 B2 | 9/2008 | Lung | |
| 7,851,849 B2 | 12/2010 | Kiyotoshi | |
| 8,659,944 B2* | 2/2014 | Hung et al. | 365/185.17 |

(Continued)

FOREIGN PATENT DOCUMENTS

| | | |
|---|---|---|
| CN | 1759482 A | 4/2006 |
| EP | 1936681 A1 | 6/2008 |
| EP | 2048709 A2 | 4/2009 |

OTHER PUBLICATIONS

Jan. 29, 2013 Office Action in related application CN 2011 10189096, 6pp.

(Continued)

*Primary Examiner* — Pho M Luu
(74) *Attorney, Agent, or Firm* — Haynes Beffel & Wolfeld LLP

(57) ABSTRACT

A source of charge carriers in thin film transistor-based memory devices is provided for a memory. The source of charge carriers can include a diode having a first and second terminal. A NAND string coupled on a first end via a first switch to a bit line, is coupled on a second end via a second switch to the first terminal of the diode. Separately drivable first and second supply lines are coupled to the first and second terminals, respectively of the diode. Circuitry is included that is coupled to the first and second supply lines, that is configured to bias the first and second supply lines with different bias conditions depending on the mode of operation, including forward bias conditions and reverse bias conditions.

24 Claims, 28 Drawing Sheets

(56) References Cited

U.S. PATENT DOCUMENTS

| | | |
|---|---|---|
| 2004/0124466 A1 | 7/2004 | Walker et al. |
| 2005/0280061 A1 | 12/2005 | Lee |
| 2007/0140001 A1 | 6/2007 | Motoi et al. |
| 2007/0253233 A1 | 11/2007 | Mueller et al. |
| 2008/0048237 A1 | 2/2008 | Iwata |
| 2008/0073635 A1 | 3/2008 | Kiyotoshi et al. |
| 2008/0096327 A1 | 4/2008 | Lee et al. |
| 2008/0101109 A1 | 5/2008 | Haring-Bolivar et al. |
| 2008/0106931 A1 | 5/2008 | Toda |
| 2008/0170429 A1 | 7/2008 | Bertin et al. |
| 2008/0180994 A1 | 7/2008 | Katsumata et al. |
| 2008/0247230 A1 | 10/2008 | Lee et al. |
| 2008/0285350 A1 | 11/2008 | Yeh |
| 2009/0097321 A1 | 4/2009 | Kim et al. |
| 2009/0184360 A1 | 7/2009 | Jin et al. |
| 2010/0226195 A1 | 9/2010 | Lue |
| 2010/0270593 A1 | 10/2010 | Lung et al. |
| 2011/0069524 A1 | 3/2011 | Toba et al. |
| 2011/0292738 A1* | 12/2011 | Hsu et al. .................. 365/185.28 |
| 2012/0051137 A1 | 3/2012 | Hung et al. |
| 2012/0182806 A1 | 7/2012 | Chen et al. |
| 2012/0281471 A1 | 11/2012 | Hung et al. |
| 2012/0327714 A1 | 12/2012 | Lue |

OTHER PUBLICATIONS

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Choi, et al. "Investigation of Gate-Induced Drain Leakage (GIDL) Current in Thin Body Devices: Single-Gate Ultra-Thin Body, Symmetrical Double-Gate, and Assymmetrical Double-Gate MOSFETs," Jpn. J. Appl. Phys. vol. 42, Apr. 2003, pp. 2073-2076.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al., "Three Dimensionally Stacked NAND Flash Memory Technology Using Stacking Single Crystal Si Layers on ILD and TANOS Structure for Beyond 30nm Node," IEEE IEDM Dec. 11-13, 2006, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Paul et al., "Impact of a Process Variation on Nanowire and Nanotube Device Performance," IEEE Trans. on Electron Devices, vol. 54, No. 9, Sep. 2007, pp. 2369-2376.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

* cited by examiner

ARRAY ARRANGEMENT INCLUDING CARRIER SOURCE

BACKGROUND OF THE INVENTION

1. Field of the Invention

The present invention relates to high density memory devices, and particularly to memory devices which can include thin film memory cells arranged to provide a three-dimensional 3D array.

2. Description of Related Art

High density memory devices are being designed that comprise arrays of flash memory cells, or other types of memory cells. In some examples, the memory cells comprise thin film transistors which can be arranged in 3D architectures.

3D memory devices have been developed in a variety of configurations that include a plurality of thin film, active strips separated by insulating material. One type of 3D memory device that uses thin film transistors as the memory cells is known as a 3D vertical gate structure such as is described in our co-pending U.S. patent application Ser. No. 13/078,311; filed 1 Apr. 2011, entitled MEMORY ARCHITECTURE OF 3D ARRAY WITH ALTERNATING MEMORY STRING ORIENTATION AND STRING SELECT STRUCTURES (US 2012/0182806 A1, published 19 Jul. 2012) which is incorporated by reference as if fully set forth herein. The 3D vertical gate structure includes a plurality of stacks of thin film strips with word line structures that overlie the stacks, such that the portions of the word line structures that extend vertically between the stacks act as the word lines for the memory cells at the cross-points with the strips. The thin film active strips in this structure, and in other memory structures, may be lightly doped and have no body contact, which can isolate them from sources of charge carriers needed during operation of the device. Conditions in which sources of charge carriers are insufficient can harm operating efficiencies.

It is desirable to provide a structure for three-dimensional integrated circuit memory with higher array efficiency.

SUMMARY

Technology is described which can address the need for a source of charge carriers in thin film transistor-based memory devices.

For example, a memory can include a diode having first and second terminals. A series arrangement that includes a plurality of memory cells, such as in a NAND string, is coupled on a first end via a first switch to a bit line, and coupled on a second end via a second switch to the first terminal of the diode. Separately drivable first and second supply lines are coupled to the first and second terminals, respectively, of the diode. A plurality of word lines are coupled to corresponding memory cells. Circuitry is included that is coupled to the first and second supply lines, that is configured to bias the first and second supply lines with different bias conditions depending on the mode of operation. In one example, the circuitry can be configured to apply an erase bias arrangement that induces hole tunneling in selected memory cells or in a block of memory cells. The erase bias arrangement for an n-channel memory cell, can include a source side bias voltage on the second supply line, which forward biases the diode providing a source of holes to the active strip or strips being erased. Also, the erase bias arrangement can include leaving the first supply line floating, and applying erase voltages to the plurality of word lines to induce hole tunneling. The circuitry can also be configured to apply a program bias arrangement that induces electron tunneling. A program bias arrangement can include applying a source side bias on the first supply line which provides a current path for the program operation, while the second supply line remains floating or is biased to reverse bias the diode.

Embodiments are described that comprise 3D memory arrangements, including a 3D vertical gate structure, in which a diode such as described above can be configured to provide a source of carriers during some modes of operation of the device. In general, a technology is provided which provides a source of charge carriers for active strips of semiconductor material which may be isolated from a conductive substrate, and which may have no body contact.

Other aspects and advantages of the present invention can be seen on review of the drawings, the detailed description and the claims, which follow.

DETAILED DESCRIPTION

A detailed description of embodiments is provided with reference to the Figures.

Figure 1:
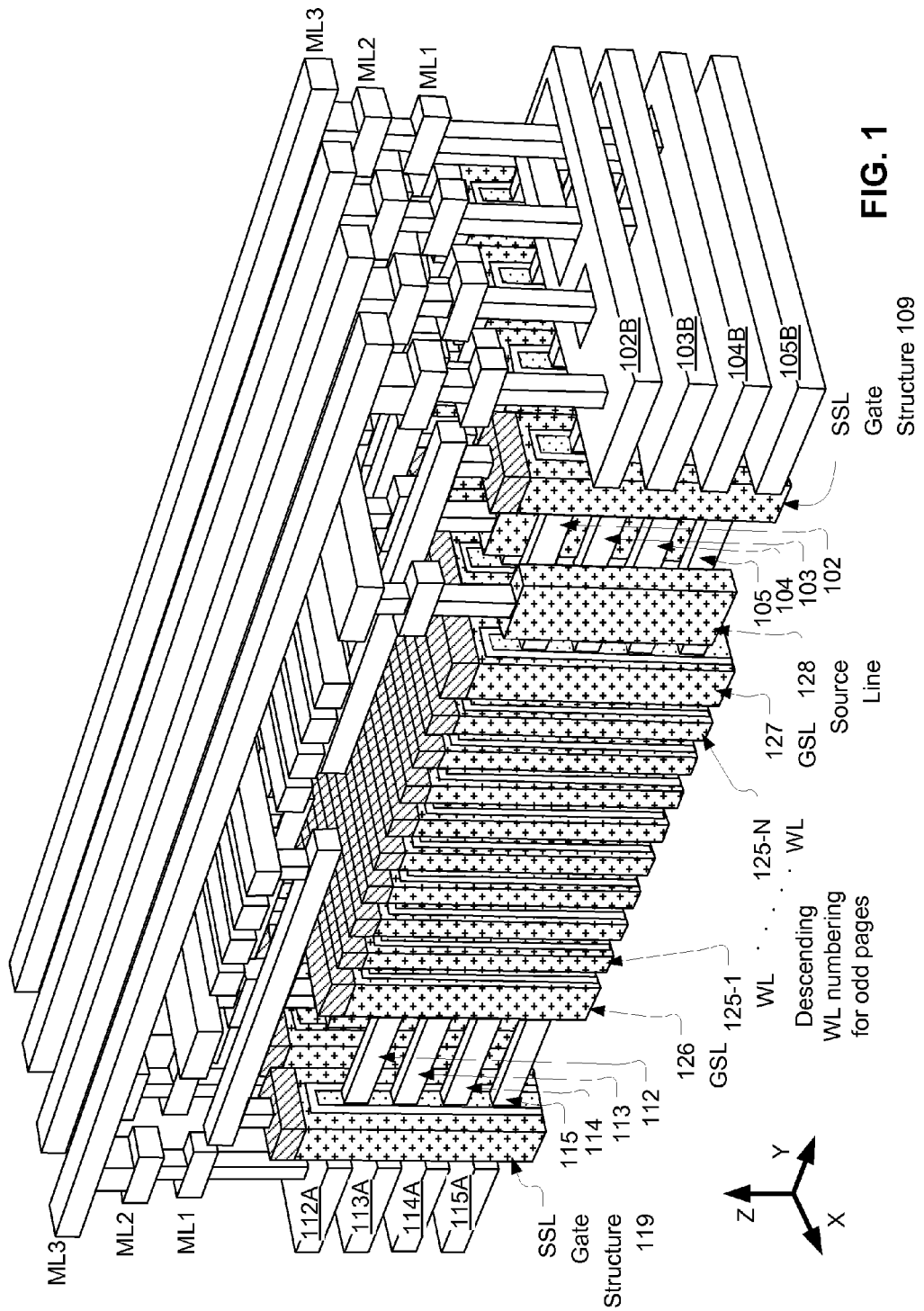
FIG. 1 is a perspective illustration of a 3D vertical gate NAND memory array structure including thin film active strips with no body contact.

FIG. 1 is a perspective illustration of a 3D NAND memory array structure as described in co-pending U.S. patent application Ser. No. 13/078,311, referred to above. Insulating material is removed from the drawing to expose additional structure for illustrative purposes. For example, insulating layers are removed between the active strips (e.g. 112-115) in stacks, and are removed between the stacks of active strips.

The multilayer array is formed on an insulating layer, and includes a plurality of word lines 125-1 WL, . . . , 125-N WL conformal with the plurality of stacks. The plurality of stacks includes active strips 112, 113, 114, 115, that comprise thin film strips of semiconductor material having a relatively low concentration of impurities, or alternatively of intrinsic semiconductor material configured to act as channels for the NAND strings. The memory devices can be configured for n-channel or p-channel operation. The active strips do not include source/drain contacts between the word lines in some example structures, and are therefore termed "contact-free" strips. Also, the active strips are not connected to a semiconductor substrate, or other semiconductor body, and therefore can be considered to be "floating" when no voltage is applied to them via the string select or ground select switches.

Active strips in the same level are electrically coupled together by a pad arranged to have a landing area for contact to an interlayer conductor. The pads for a plurality of layers can be arranged in stairstep structures as shown in FIG. 1, with the landing area on each successive pad disposed on a step of the structure. Landing areas for connection of the pads and the interlayer conductors to the landing areas on the pads can be arranged in patterns other than a simple stairstep, if desired or needed for a particular manufacturing setting.

The shown word line numbering, ascending from 1 to N going from the back to the front of the overall structure, applies to even memory pages. For odd memory pages, the word line numbering descends from N to 1 going from the back to the front of the overall structure.

Pads 112A, 113A, 114A, 115A terminate alternate active strips, such as active strips 112, 113, 114, 115 in each layer in this example. As illustrated, these pads 112A, 113A, 114A, 115A are electrically connected to different bit lines for connection to decoding circuitry to select planes within the array. These pads 112A, 113A, 114A, 115A can be patterned at the same time that the plurality of stacks are defined.

Pads 102B, 103B, 104B, 105B terminate the other alternate active strips, such as active strips 102, 103, 104, 105 in each layer. As illustrated, these pads 102B, 103B, 104B, 105B are electrically connected to different bit lines for connection to decoding circuitry to select planes within the array. These pads 102B, 103B, 104B, 105B can be patterned, with possible the exception of vias to the landing areas, at the same time that the plurality of stacks are defined.

In other examples, all the active strips in a block can terminate at a bit line pad on the same end.

Any given stack of active strips is coupled to either the pads 112A, 113A, 114A, 115A, or the pads 102B, 103B, 104B, 105B, but not both, in the illustrated example. A stack of active strips has one of the two opposite orientations of bit line end-to-source line end orientation, or source line end-to-bit line end orientation. For example, the stack of active strips 112, 113, 114, 115 has bit line end-to-source line end orientation; and the stack of active strips 102, 103, 104, 105 has source line end-to-bit line end orientation.

The stack of active strips 112, 113, 114, 115 is terminated at one end by the pads 112A, 113A, 114A, 115A, passes through SSL gate structure 119, ground select line GSL 126, word lines 125-1 WL through 125-N WL, ground select line GSL 127, and is terminated at the other end by source line 128. The stack of active strips 112, 113, 114, 115 does not reach the pads 102B, 103B, 104B, 105B.

The stack of active strips 102, 103, 104, 105 is terminated at one end by the pads 102B, 103B, 104B, 105B, passes through string select SSL gate structure 109, ground select line GSL 127, word lines 125-N WL through 125-1 WL, ground select line GSL 126, and is terminated at the other end by a source line (obscured by other parts of figure). The stack of active strips 102, 103, 104, 105 does not reach the pads 112A, 113A, 114A, 115A.

A layer of memory material separates the word lines 125-1 WL through 125-N WL, from the active strips 112-115 and 102-105. Ground select lines GSL 126 and GSL 127 are conformal with the plurality of active strips, similar to the SSL gate structures.

Every stack of active strips is terminated at one end by pads, and at the other end by a source line. For example, the stack of active strips 112, 113, 114, 115 is terminated at one end by pads 112A, 113A, 114A, 115A, and terminated on the other end by source line 128. At the near end of the figure, every other stack of active strips is terminated by the pads 102B, 103B, 104B, 105B; and every other stack of active strips is terminated by a separate source line. At the far end of the figure, every other stack of active strips is terminated by the pads 112A, 113A, 114A, 115A, and every other stack of active strips is terminated by a separate source line.

Bit lines and string select lines are formed at patterned conductor layers, such as metals layers ML1, ML2, and ML3. Transistors are formed at cross-points between the active strips (e.g. 112-115) and the word line 125-1 WL through 125-N WL. In the transistors, the active strip (e.g. 113) acts as the channel region of the device.

String select structures (e.g. 119, 109) can be patterned during the same step that the word lines 125-0 through 125-15 are defined. Transistors are formed at cross-points between the active strips (e.g. 112-115) and the string select structures (e.g. 119, 109). These transistors act as string select switches coupled to decoding circuitry for selecting particular stacks in the array.

A charge storage structure layer is disposed at least in the cross-points in which memory cells are formed. The charge storage layer structure can comprise a multilayer dielectric charge storage structure such as SONOS-like structures. One dielectric charge storage structure is known as bandgap engineered SONOS, or "BE-SONOS." A BE-SONOS charge storage structure can include a multilayer tunneling layer, such as a layer of silicon oxide about 2 nm thick, a layer of silicon nitride about 2 to 3 nm thick and a layer of silicon oxide about 2 to 3 nm thick. A BE-SONOS structure includes a dielectric layer for storing charge on the multilayer tunneling layer, such as a layer of silicon nitride about 5 to 7 nm thick. Also, a BE-SONOS structure includes a dielectric layer for blocking charge leakage on the charge storage layer, such as a layer of silicon oxide about 5 to 8 nm thick. Other materials may be utilized as well in the BE-SONOS stack.

In a device including a BE-SONOS charge storage layer, an erasing operation can include FN tunneling holes from the channel to the charge storage layer to compensate the trapped electrons in the charge storage layer.

However, for a structure like that shown in FIG. 1, there is no P+ region within the whole string. A band-to-band hot hole current can be induced by a gate induced drain leakage GIDL mechanism. However, an additional or alternative source of holes can be needed. As described herein, a carrier source comprising a diode can generate holes source to solve this issue.

Figure 2:
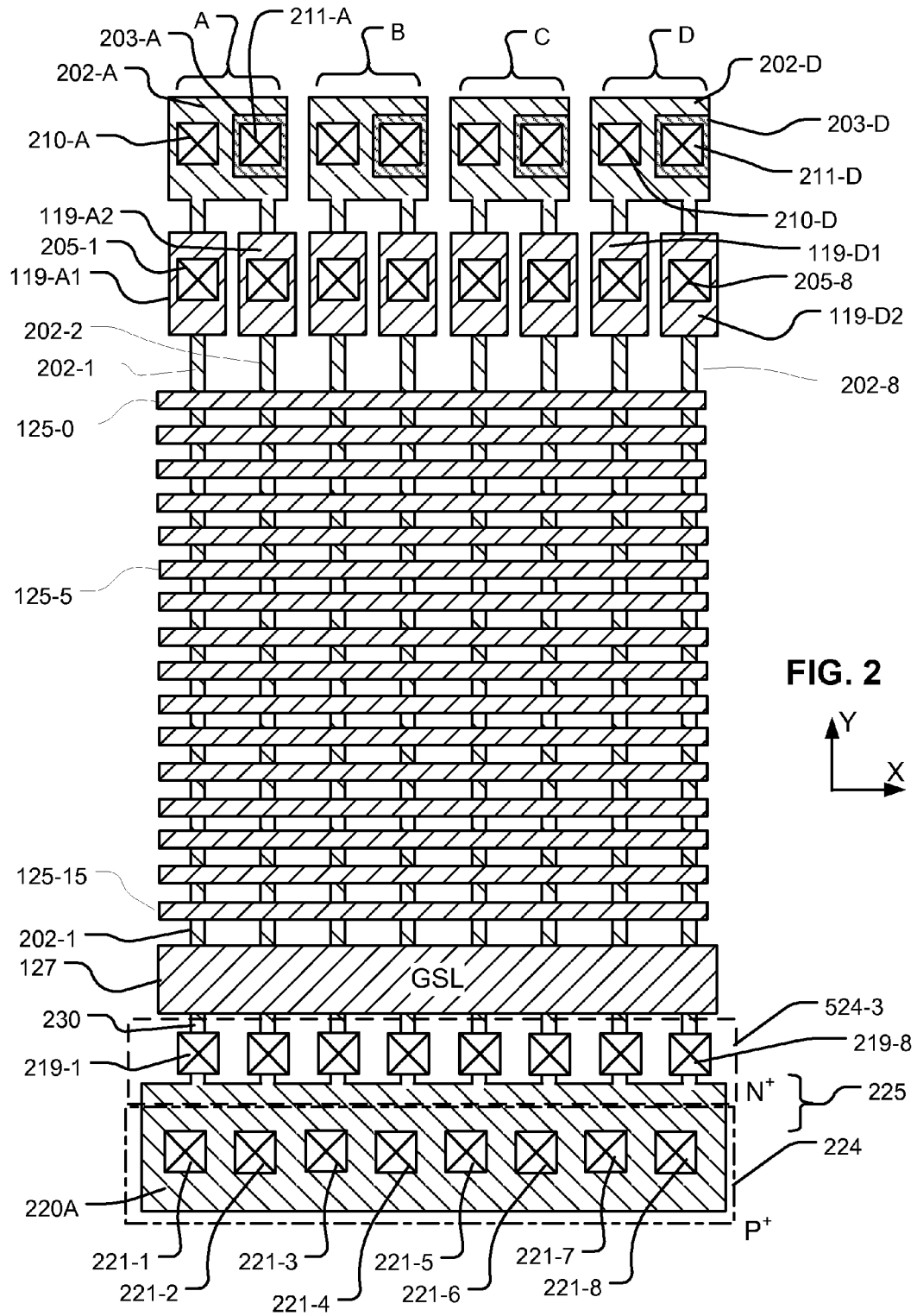
FIG. 2 is a layout view of one embodiment of a 3D vertical gate memory including diode structures as described herein.

FIG. 2 is a layout view of a first array arrangement for a finger VG (vertical gate) 3D NAND memory device. For reference, the "X" axis lies in the horizontal direction parallel to the word lines (e.g. 125-0, 125-5, 125-15) in the structure, the "Y" axis lies in the horizontal direction parallel to the active strips (e.g. 202-1, 202-2, 202-8) in the structure, and the "Z" axis lies in the vertical direction orthogonal to the word lines and to the active strips in the structure.

In the layout view of FIG. 2, the array arrangement includes a plurality of active strips. The memory cells are disposed at cross-points of active strips (e.g. 202-1, 202-2, 202-8) and word lines (e.g. 125-0, 125-5, 125-15). In the illustrated example, there are four blocks of cells, labeled generally A, B, C, D, each having for the purposes of a simplified example, two stacks of active strips two layers deep. In other embodiments, there may be more layers such as 4, 8, 16 or more, and there may be stacks of strips per block, such as 4, 8, 16 or more. In this example, the four illustrated blocks A, B, C, D share a carrier source structure as described in more detail below.

Figure 12:
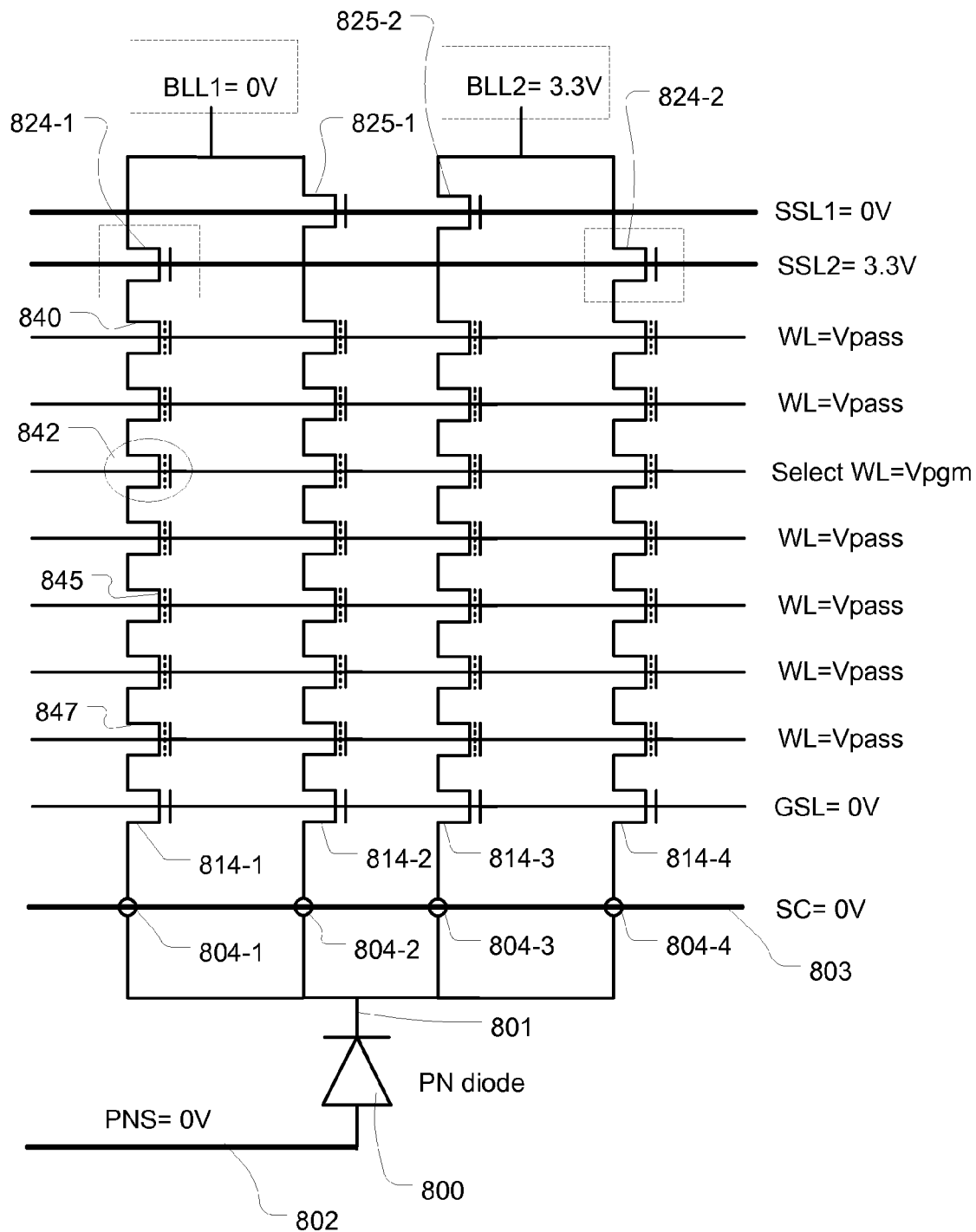
FIG. 12 is a schematic diagram of a 3D NAND like that of FIG. 2, showing a bias arrangement for a programming operation.

The active strips in the top level run from a corresponding pad (top level pads 202-A, 202-D) at the top to the carrier source structures with corresponding first and second supply lines (lines 802 and 803 shown in FIG. 12, which can be connected to contacts 219-1 to 219-8 and to contacts 221-1 to 221-8 shown in FIG. 2, and replacing the common source lines 128 of the structure in FIG. 1). The carrier source structures include first supply line contacts 219-1 to 219-8 in the N+ region 524-3 of the strips, pad 220A including a P+ region, with second supply line contacts 221-1 to 221-8 in the P+ region of the pad. The N+ region 524-3 establishes source terminals for the GLS transistors and may extend to the GLS line 127 and partly into the pad 220. In an interface region 225 between the N+ region 524-3 and the P+ region 224 on the supply line contact pad 220A, a PN junction for a diode is provided. In a p-channel embodiment, the doping types of the regions 224 and 524-3 are reversed.

The active strips in the lower level run from a corresponding pad (lower level pads 203-A, 203D) which are accessible through stairstep openings in the upper level pads as shown. Interlayer connectors 210-A to 210-D and 211-A to 211-D couple the pads to overlying bit lines in a patterned conductor layer for example, like those in ML3 shown in FIG. 1.

Overlying the active strips (e.g. 202-1, 202-2, 202-8), are the horizontal word lines (e.g. 125-0, 125-5, 125-15) and the horizontal ground select line GSL 127. Also overlying the active strips, are the string select line SSL gate structures, including SSL gate structures 119-A1 and 119-A2 for the strips coupled to pads 202-A and 203-A, SSL gate structures 119-D1 and 119-D2 for the strips coupled to pads 202-D and 203D, and similar SSL gate structure for blocks B and C not given reference numerals. The string select structures control electrical connection between any active strip and the active strip's corresponding pad (e.g. 202-A, 203-A). Interlayer connectors 205-1 to 205-8 couple the SSL gate structures to overlying SSL lines in a patterned conductor layer for example, like those in ML2 shown in FIG. 1.

The 3D NAND memory device includes a plurality of planes of memory cells. A plurality of bit lines selects a particular plane in the plurality of planes of memory cells via pads (e.g. 202-A and 203-A). The particular plane is decoded by a plurality of string select structures, horizontal ground select lines GSL, and word lines. To select a particular stack (e.g. including top level strip 202-1) in an n-channel embodiment, a positive SSL voltage ($V_{SSL}$) is applied to the string select structure (119-A1). To unselect other stacks, a voltage of 0V, for example, can be applied to the string select structures.

Figure 2A:
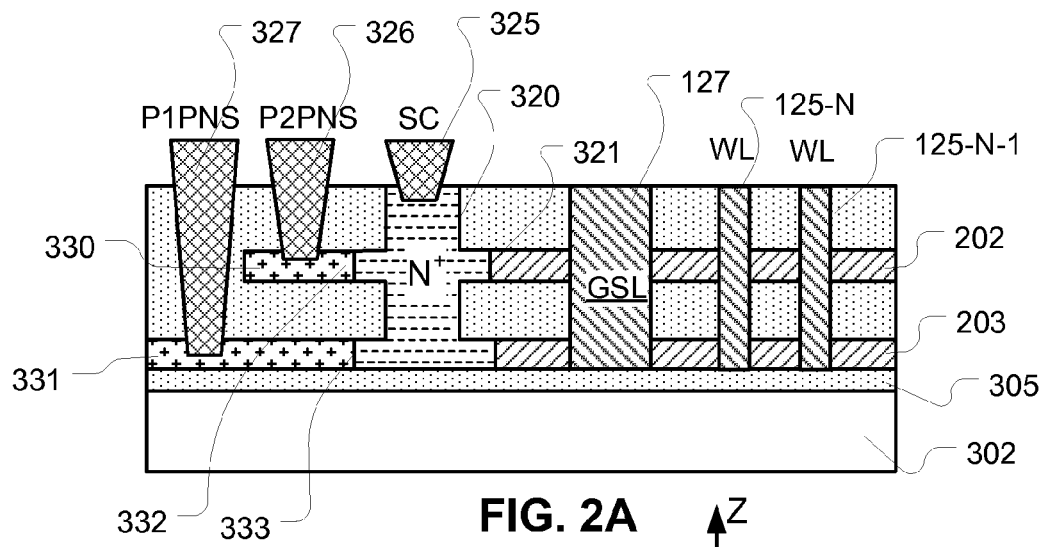
FIGS. 2A, 2B and 2C illustrate diode structures suitable for use in a 3D memory such as that described with reference to FIG. 2.
Figure 2B:
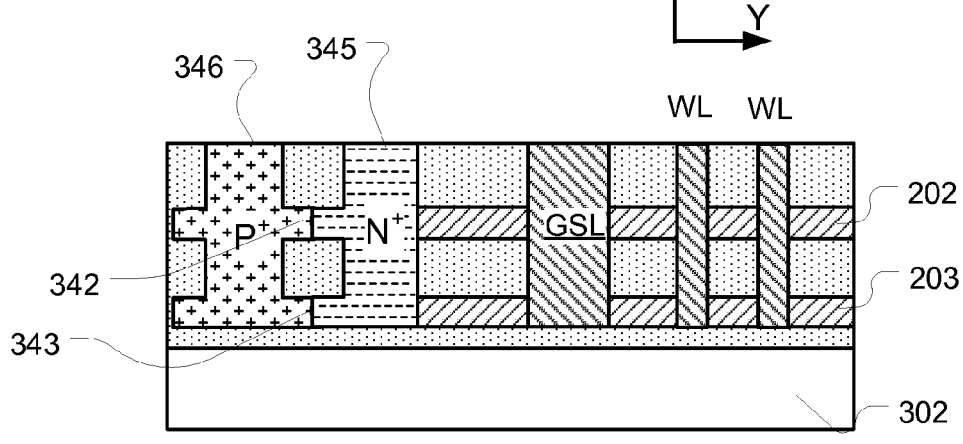
Figure 2C:
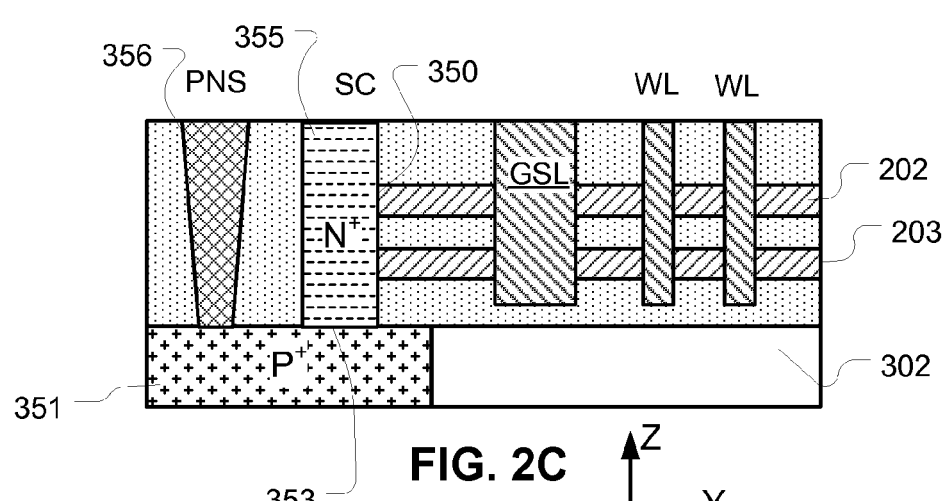

FIGS. 2A-2C show alternative structures for the carrier source structure, which can be used in a layout like that of FIG. 2.

FIG. 2A is a side view in the Z-Y plane showing a carrier source structure at the end of a stack of active strips 202, 203 for a structure like that of FIG. 2. The stack of active strips 202, 203 is disposed on an insulating layer 305 over a substrate 302. The GSL line 127 is disposed adjacent on one side to the word lines 125-N, 125-N-1 and so on. In this example, the active strips 202, 203 extend through the GSL line 127 to an N+ terminal region 321 in the strips. The terminal region 321 is in contact with or is part of an N+ column 320 of semiconductor material, which provides the N+ terminal for the strips. An interlayer conductor 325 is coupled to the top of the column 320 and provides for connection to a first supply line. The strips 202, 203 extend through the vertical column 320 into P+ regions in the supply line contact pads 330, 331. Junctions 332, 333 between the P+ regions in the supply line contact pads 330, 331 and the N+ regions on the column 320 establish diodes. Interlayer conductors 326, 327, which can comprise tungsten plugs, for example, extend from the P+ regions in the supply line contact pads 330, 331, in a stairstep-like structure, and provide for connection to a second supply line, or to separate second supply lines for each level.

FIG. 2B is a side view of an alternative carrier source structure where like reference numerals refer to like components. In the structure, the strips 202, 203 extend semiconductor pads including a vertical column 345 of N+ semiconductor material which is connected to a first supply line (not shown). Also, the semiconductor pads include vertical column 346 of P+ semiconductor material connected with the pads which result in the PN junctions 342, 343. The vertical column 346 provides for connection to a second supply line (not shown).

FIG. 2C illustrates the side view of yet another alternative carrier source structure. In this example, the strips terminate (e.g., strip 202 terminates at interface 350) at vertical column 355 of N+ semiconductor material which is connected to a first supply line (not shown). The vertical column 355 is coupled to a P+ region 351 in the semiconductor substrate 302, establishing a PN junction 353 at the interface. An interlayer conductor 356, which can comprise a tungsten plug, for example, provides for connection of the P+ region 351 to a second supply line (not shown). FIGS. 2A-2C illustrate carrier source structures based on diodes that can be used with 3D memories. Other configurations can also be utilized as suits the implementation of the memory and other factors.

Figure 3:
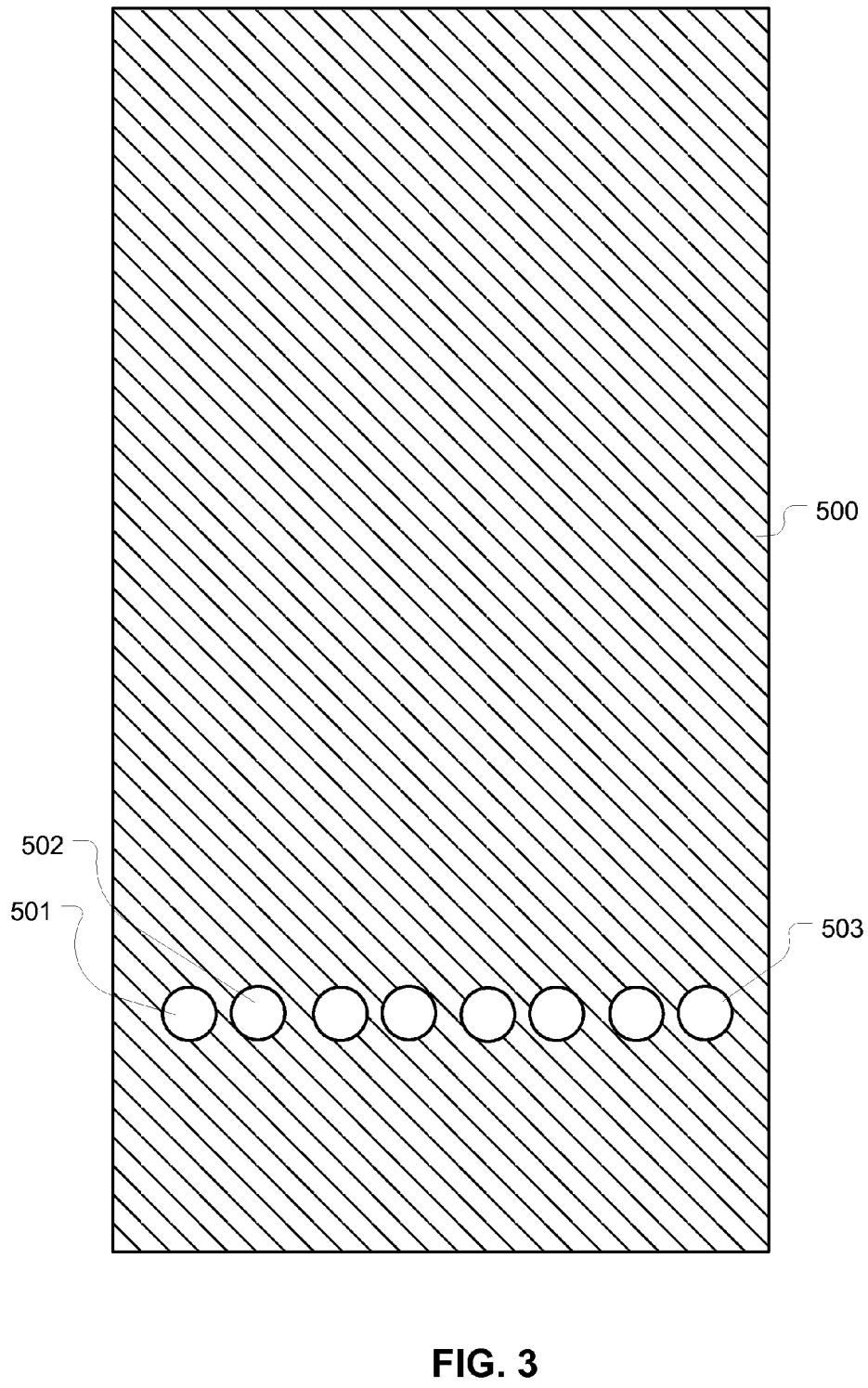
FIG. 3 is a layout view of an intermediate structure in a manufacturing process for a structure like that of FIG. 2 with a diode structure like that of FIG. 2A.

FIGS. 3, 3A, 3B, 4, 4A, 4B, 5, 5A, 5B, 6, 6A, 6B, 6C, 6D, 7, 7A and 7B illustrate stages in a manufacturing process for a memory structure like that in FIG. 2 having a carrier source structure like that in FIG. 2A. FIG. 3 is a plan view showing a top layer 500 of material to be used for implementation of active strips, which can overlie a stack of alternating active material and insulating material as described above. The material to be used for implementation of active strips can be a semiconductor such as silicon deposited as a layer of polysilicon. Alternatively, the material can be a single crystal semiconductor and can be other semiconductor materials. The material can be relatively lightly doped, suitable for use as channels for thin film transistors, or intrinsically doped as suits the particular need. For n-channel thin film transistors, the material has a light p-type doping or intrinsic doping.

As illustrated in FIG. 3, after forming the stack of alternating active material and insulating material, vias (e.g. 501, 502, 503) are opened in a pattern through the stack, extending at least to the bottom layer of active material. For a structure having eight stacks of active strips, eight vias are opened, one for each strip. The vias (e.g. 501, 502, 503) are aligned over the location of the strips to be formed by patterning the stack of alternating active material and insulating material.

Figure 3A:
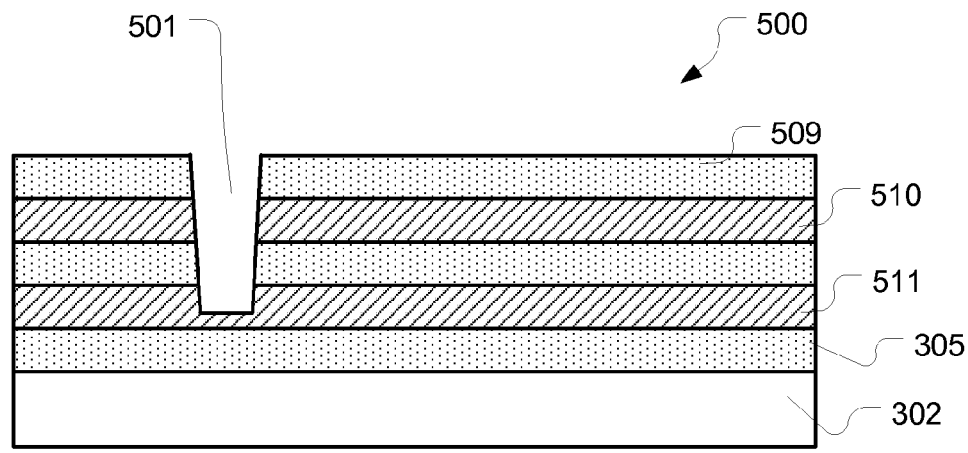
FIGS. 3A and 3B are cross-sectional views illustrating stages in the manufacturing process based on the layout view of FIG. 3.

FIG. 3A shows a side view of the stack of alternating active material and insulating material. In this view, a substrate 302, which can be a semiconductor or other material, is overlaid by a layer 305 of insulating material. A first layer 511 of active material and a second layer 510 of active material are separated by an insulating layer. A top layer 509 of insulating material overlies the stack. A via 501 is opened through the top layer 509 of insulating material, and extends at least into the first layer 511 of active material.

Figure 3B:
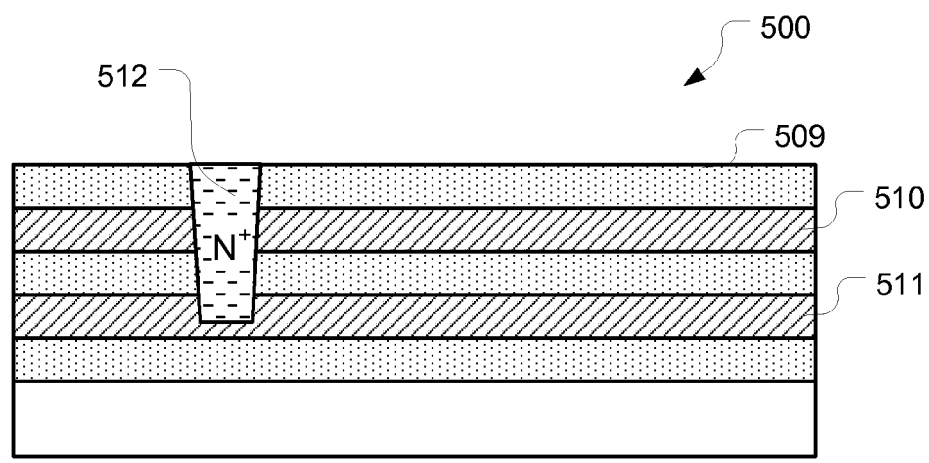

FIG. 3B shows a side view of the stack after filling the via 501 in FIG. 3A with a semiconductor material 512 having N+ doping. A planarizing step can be applied to establish a surface in which the top of the semiconductor material 512 is aligned with the top layer 509 of insulating material.

Figure 4:
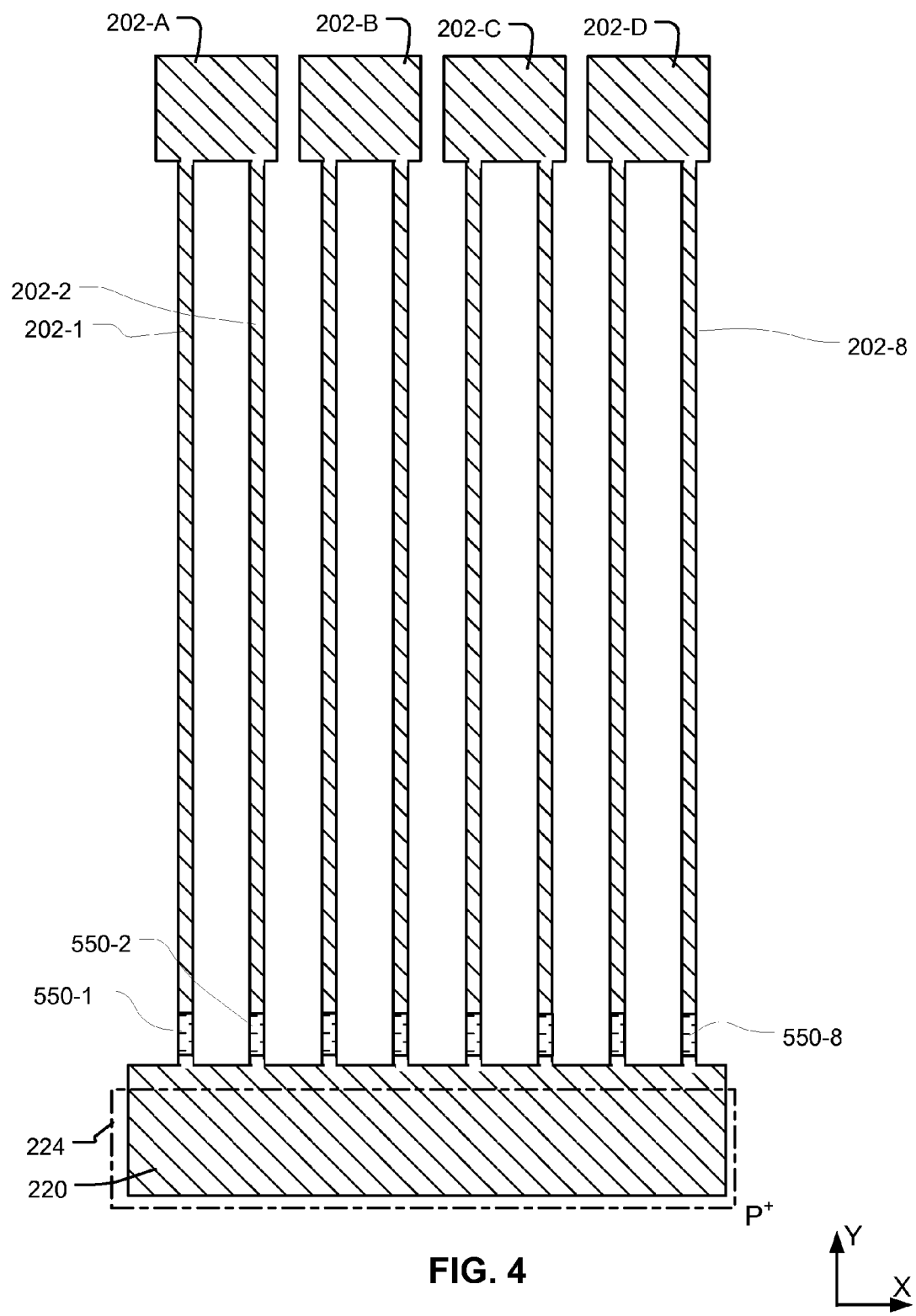
FIG. 4 is a layout view of another intermediate structure in the manufacturing process for a structure like that of FIG. 2 with a diode structure like that of FIG. 2A.

FIG. 4 is a plan view after applying a patterned etch process to the structure after the step shown in FIG. 3B. The patterned etch defines a plurality of bit line contact pads 202-A, 202-B, 202-C, 202-D to be utilized for each of the 3D blocks A, B, C, D shown in FIG. 2. Also, the patterned etch defines a supply line contact pad 220, which in this example is shared among all four of the blocks. Active strips (e.g. 202-1, 202-2, 202-8) of semiconductor material extend from the pad 220 to a corresponding bit line contact pad 202-A, 202-B, 202-C, 202-D.

As illustrated in FIG. 4, the patterned etch also etches through the semiconductor material 512 which filled the vias (e.g. 501, 502, 503) shown in FIG. 2. As a result, pillars (e.g. 550-1, 550-2, 550-8) of N+ type semiconductor material connect the active strip in the first layer with the active strip in the upper layer, and have widths in this example, that match the widths of the active strips. In other embodiments, the pattern may have variant widths in the region of the pillars if desired.

FIG. 4 also illustrates the region 224 in which P+ doping is applied to the supply line contact pad 220.

Figure 4A:
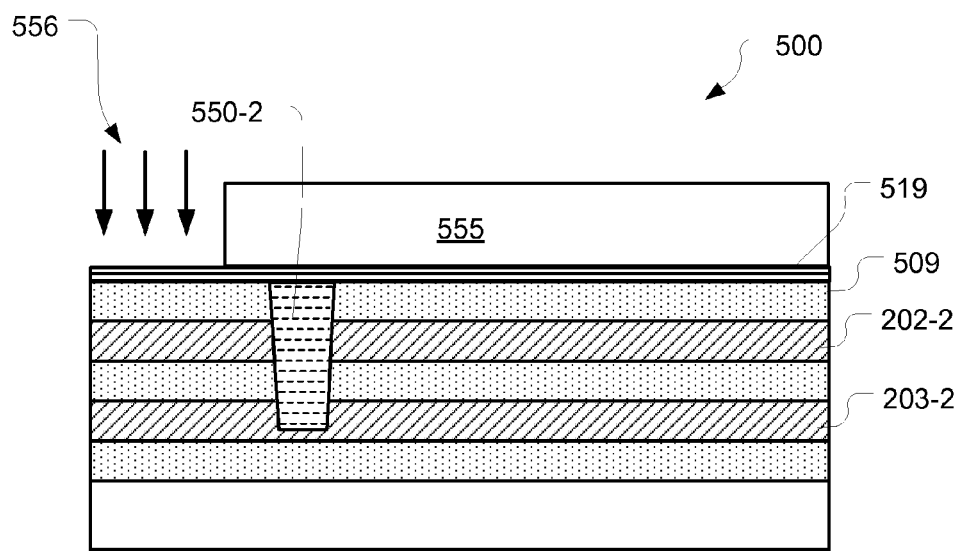
FIGS. 4A and 4B are cross-sectional views illustrating additional stages in the manufacturing process based on the layout view of FIG. 4.

FIG. 4A shows a side view of the stack taken along one of the active strips (e.g. 202-2). Thus, the first and second layers of semiconductor material have been patterned to define the stacks of active strips, including lower strip 203-2 and upper strip 202-2 for this two-layer example. FIG. 4A shows that a charge storage structure layer 519 is deposited over the patterned active strips. Also, a mask such as a photoresist mask 555 overlies the structure with an opening to expose the region 224 for P+ implant 556. The P+ implant is applied with sufficient energy to induce P+ doping in both lower and upper supply line contact pads in the first and second layers of active material.

Figure 4B:
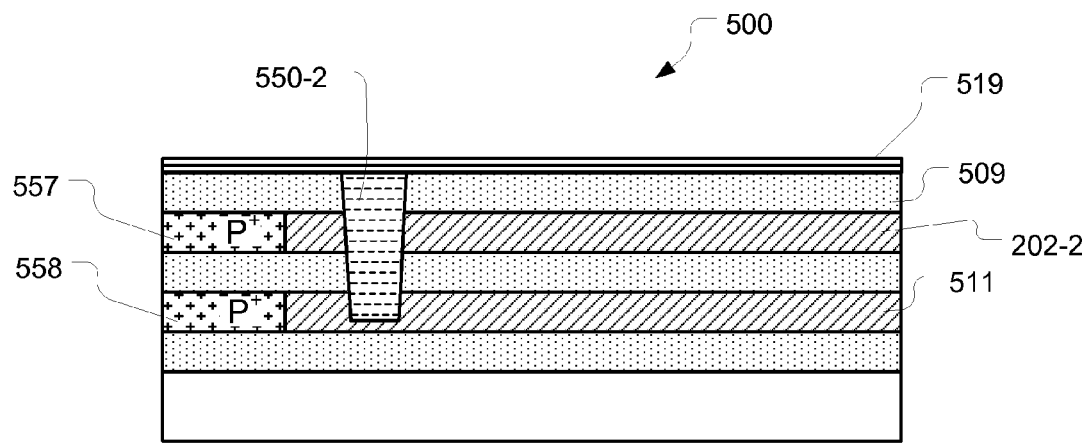

FIG. 4B illustrates the results of the implant after removal of the mask 555. The structure of FIG. 4B includes P+ region 557 in the supply line contact pad, in the same layer as the upper strip 202-2, and P+ region 558 in the supply line contact pad, in the same layer as the lower strip 203-2.

Figure 5:
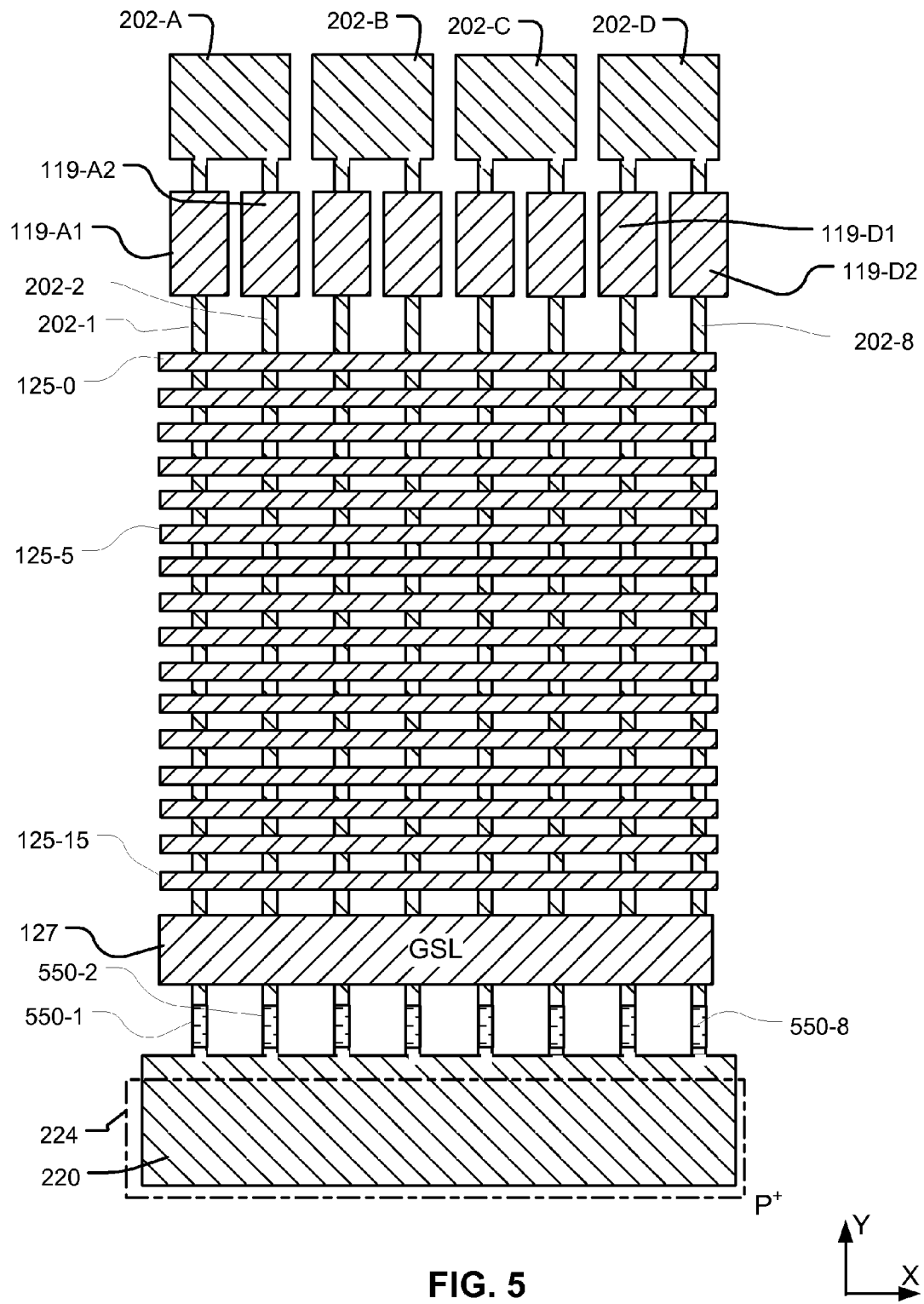
FIG. 5 is a layout view of yet another intermediate structure in the manufacturing process for a structure like that of FIG. 2.
Figure 5A:
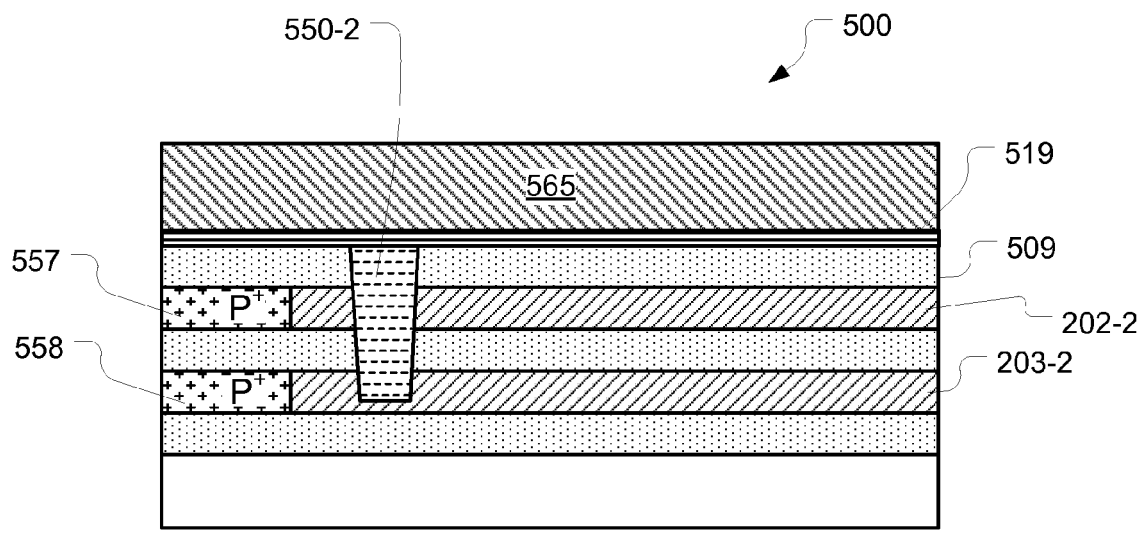
FIGS. 5A and 5B are cross-sectional views illustrating additional stages in the manufacturing process based on the layout view of FIG. 5.

FIG. 5 is a plan view after applying a process to form the word lines, ground select lines and string select structures. The process can include depositing a layer of P+ or N+ doped polysilicon over the charge storage structure layer (not shown in FIG. 5), in a manner that fills the trenches between the active strips (e.g. 202-1, 202-2, 202-8), thereby forming vertical gate structures between the strips.

As a result of this process, the active strips (e.g. 202-1, 202-2, 202-8), are overlaid by the horizontal word lines (e.g. 125-0, 125-5, 125-15) and the horizontal ground select line GSL 127. Also overlying the active strips are the string select line SSL gate structures, including SSL gate structures 119-A1 and 119-A2 for the strips coupled to pads 202-A and 203-A, SSL gate structures 119-D1 and 119-D2 for the strips coupled to pads 202-D and 203D, and similar SSL gate structure for blocks B and C, not given reference numerals. At the cross-points of the active strips with vertical gate structures on the word lines 125-0 to 125-15, flash memory cells are formed which consist of thin film, dual-gate, charge storage transistors. At the cross-points of the active strips with the vertical gate structure on the ground select line 127 and on the string select structures (e.g. 119-A1), dual gate transistors are formed which act as switches that can selectively couple the string of memory cells along the active strips to the bit line pads or to the carrier source structure.

Figure 6:
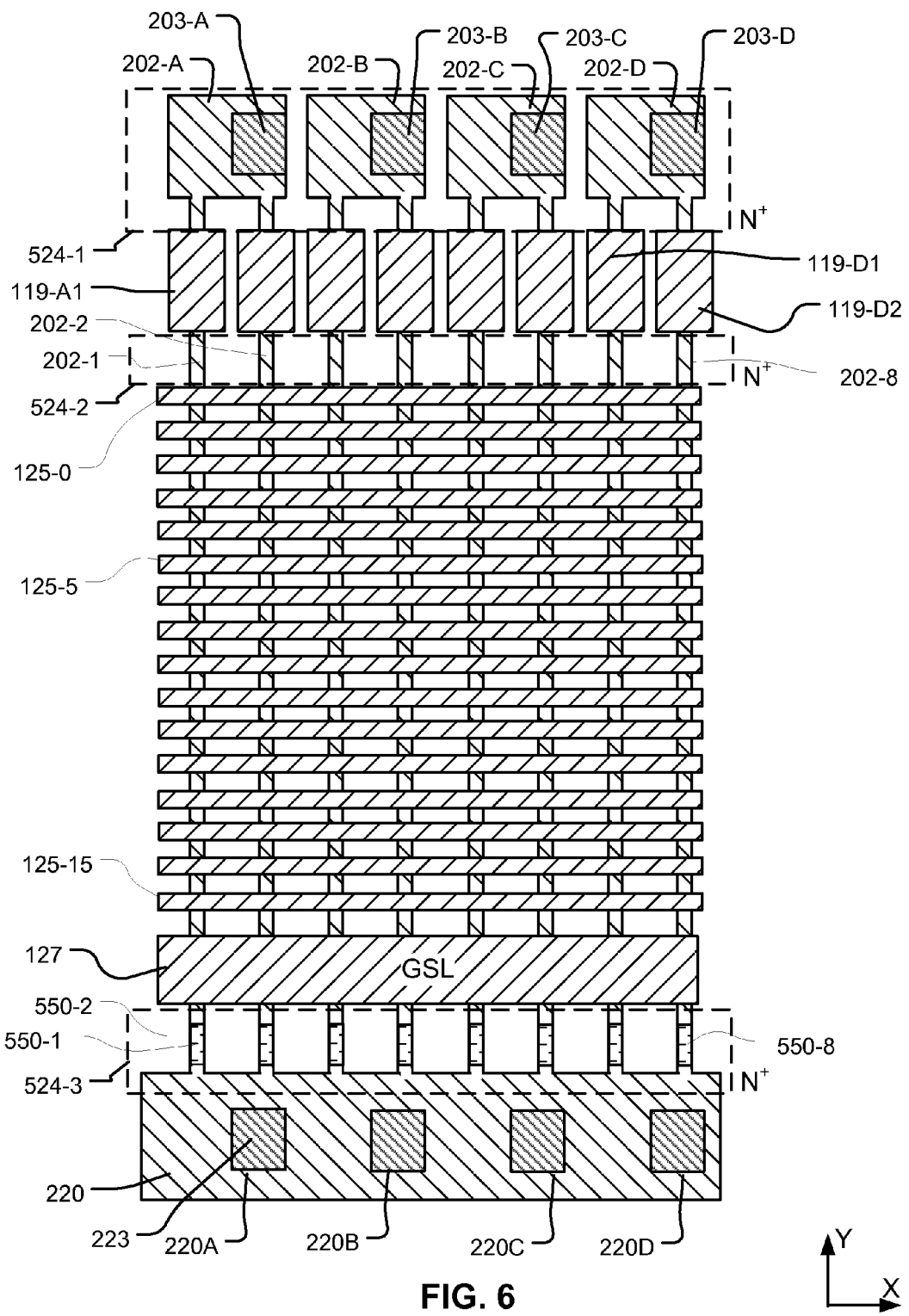
FIG. 6 is a layout view of a further intermediate structure in the manufacturing process for a structure like that of FIG. 2.

FIG. 6 is a plan view after applying a process to form openings 220A, 220B, 220C and 220D in the supply line contact pad 220, and corresponding openings in the bit line contact pads 202-A, 202-B, 202-C and 202-D. These openings expose the underlying supply line contact pad 223 and the underlying bit line contact pads 203-A, 203-B, 203-C and 203-D so that interlayer contacts can be made with them. Also, a pattern for the N+ doping region is illustrated, including N+ region 524-1 over the bit line contact pads, N+ region 524-2 between the string select structures (e.g. 119-A1) and the first word line 125-0, and N+ region 524-3 over the N+ pillars (e.g. 550-2) in the active strips. The N+ region 524-3 also partly overlies the supply line contact pad 220, and extends along the strips upwardly to, or close to, the GSL line 127.

Figure 5B:
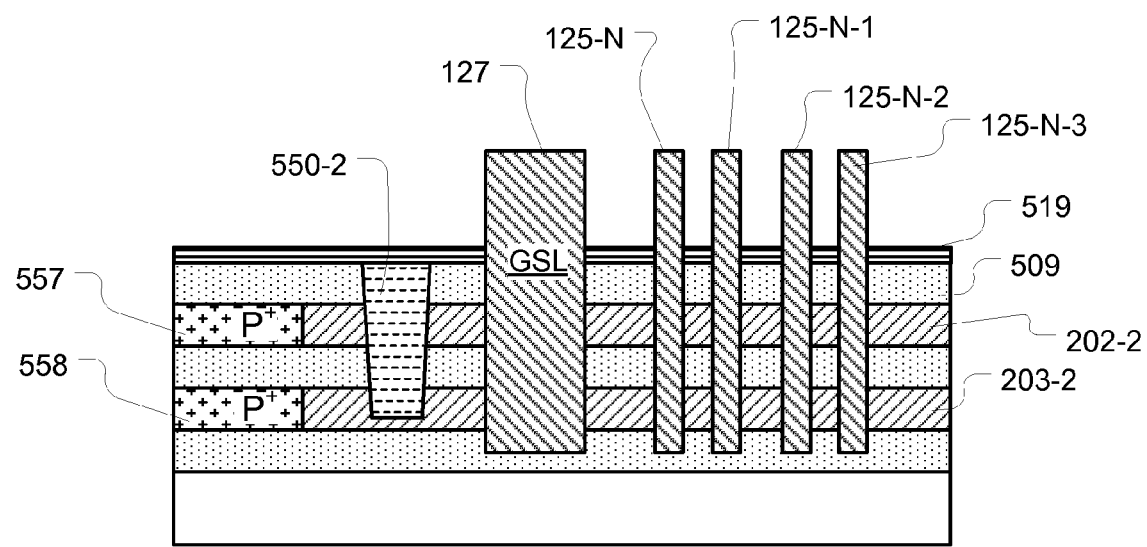
Figure 6A:
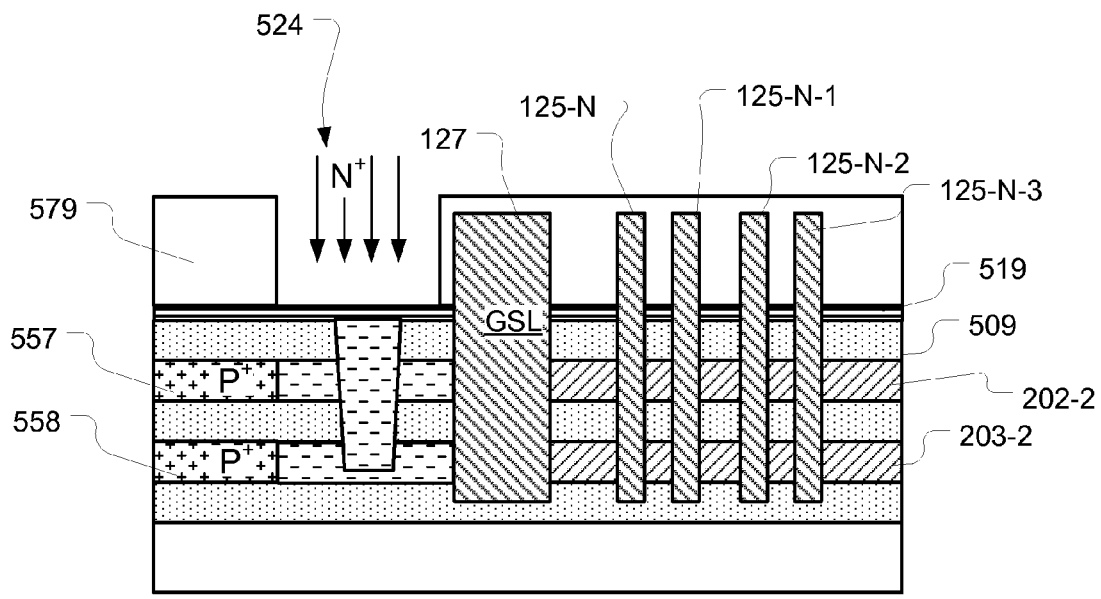
FIGS. 6A, 6B, 6C and 6D are cross-sectional views illustrating additional stages in the manufacturing process based on the layout view of FIG. 6.

FIG. 6A is a side view of the structure like that of FIG. 5B showing a photolithographic mask 579 overlying the structure, with an opening corresponding to the region 524-3. The opening allows the implant 524 of N-type dopants, which reach into the lower layer 203-2 as shown.

Figure 6B:
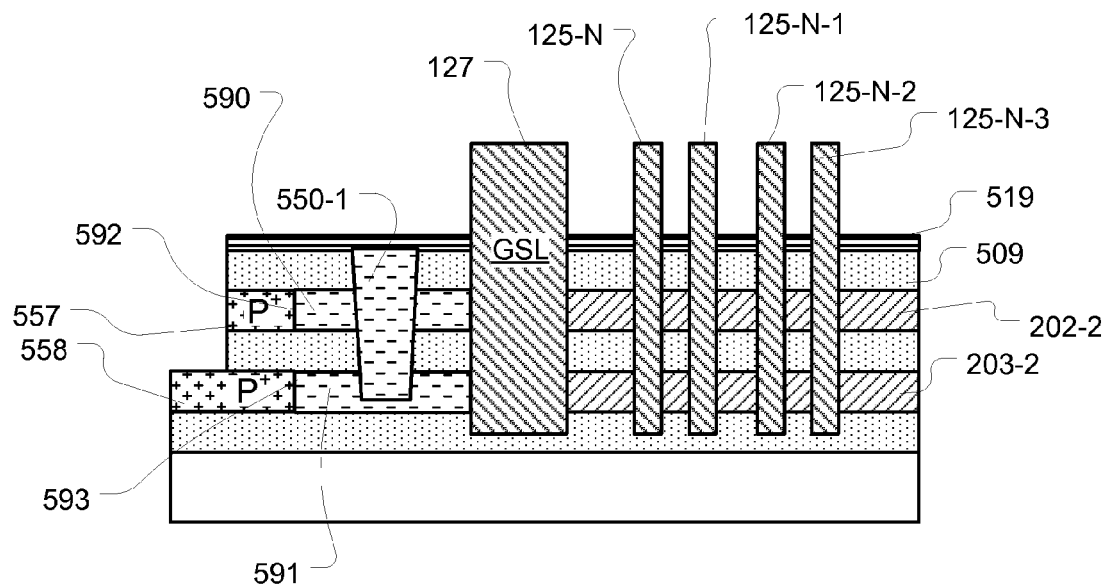

FIG. 6B illustrates the stairstep opening 220A (see FIG. 6) which is formed after removal of the mask 579. As illustrated in FIG. 6B, a PN junction 592 is formed between the N+ region 590 in the upper layer, and the P+ region 557 in the upper layer. Likewise, a PN junction 593 is formed between the N+ region 591 in the lower layer 591, and the P+ region 558 in the lower layer.

Figure 6C:
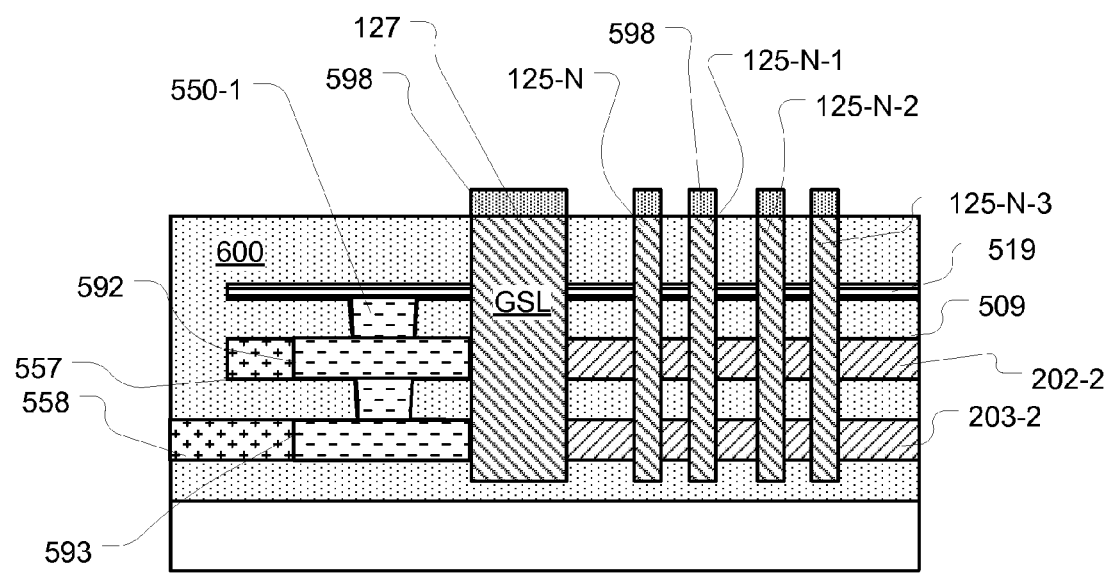

FIG. 6C shows formation of a layer of insulating fill 600 over the structure, which can then be planarized to expose the top surfaces of the word lines (e.g. 125-N) and the GSL line 127. Then, a silicide layer 598, such as a cobalt silicide, is formed over the GSL line and the word lines. Also, the silicide layer 598 is formed over the string select structures (not shown in FIG. 6C) in preferred embodiments.

Figure 6D:
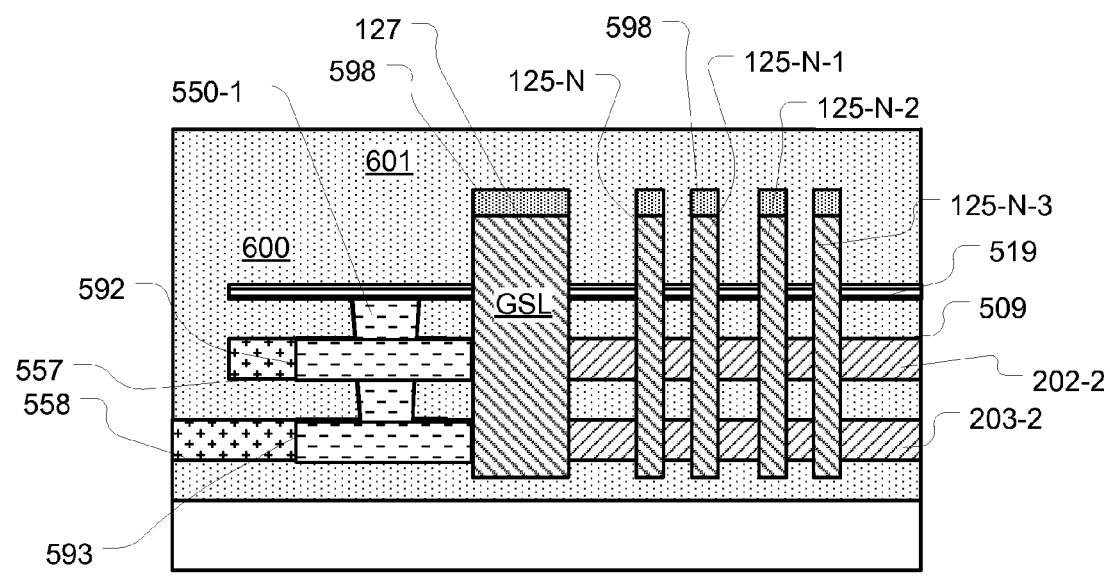

FIG. 6D illustrates that another interlayer dielectric fill 601 is formed over the silicide layers. This interlayer dielectric fill 601 isolates the word lines, ground select gate and string select gate structures from overlying patterned conductor layers.

Figure 7:
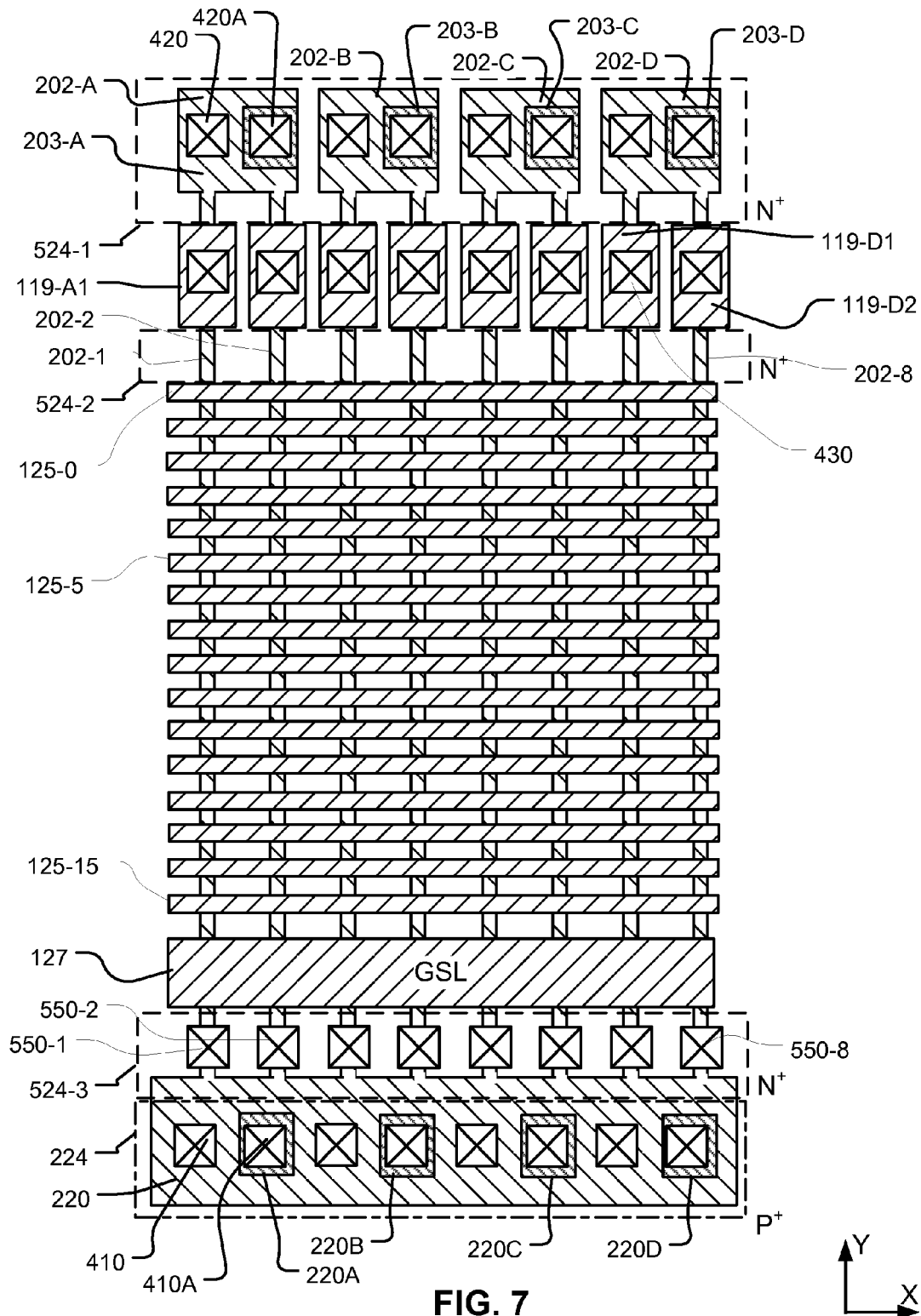
FIG. 7 is a layout view of an intermediate structure after that of FIG. 6 in the manufacturing process for a structure like that of FIG. 2.

FIG. 7 is a plan view after applying a process to form interlayer contacts in the structure. The structure includes stairstep contacts (e.g. 410, 410A) in the supply line pads 220, 223, and stairstep contacts (e.g. 420, 420A) in the bit line pads (e.g. 202-A, 203-A). Also, the structure includes interlayer contacts (e.g. 430) on the string select structures (e.g. 119-D1). FIG. 7 consolidates many of the features of FIGS. 4, 5 and 6, which are described above.

Figure 7A:
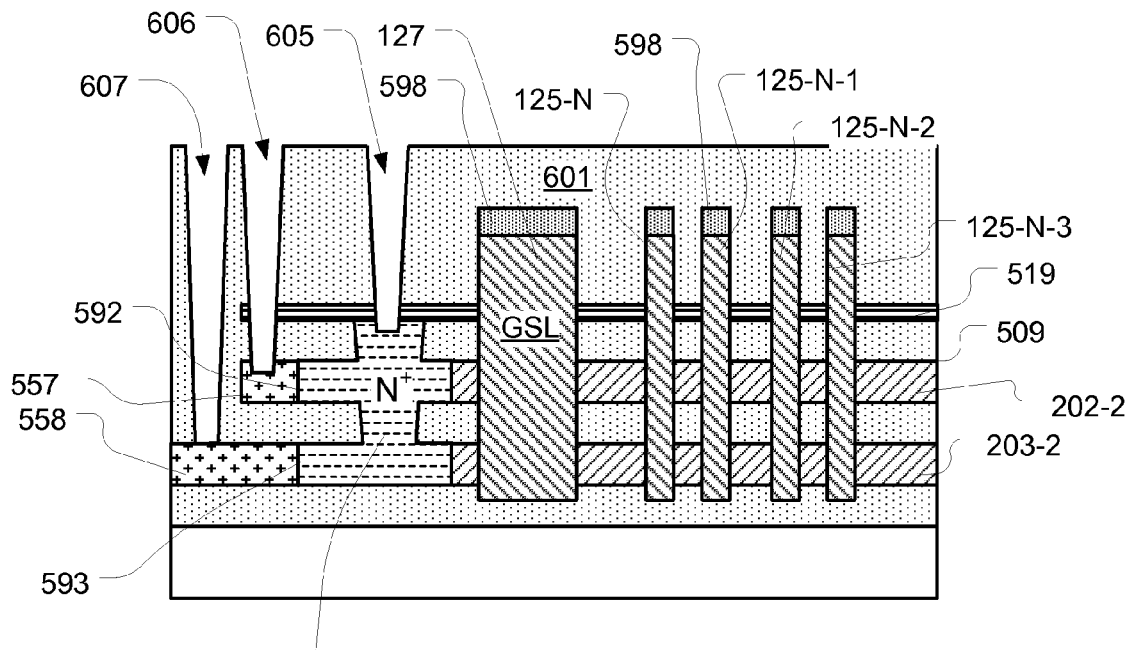
FIGS. 7A and 7B are cross-sectional views illustrating additional stages in the manufacturing process based on the layout view of FIG. 7.

FIG. 7A is a side view showing openings 605, 606, 607 which are formed through the fill layer 601, 600, and through the charge storage structure layer 519 to make contact with the N+ pillar 550-2, and to make contact in the region 557 with the supply line contact pad on the upper layer, and the region 558 on the lower layer.

Figure 7B:
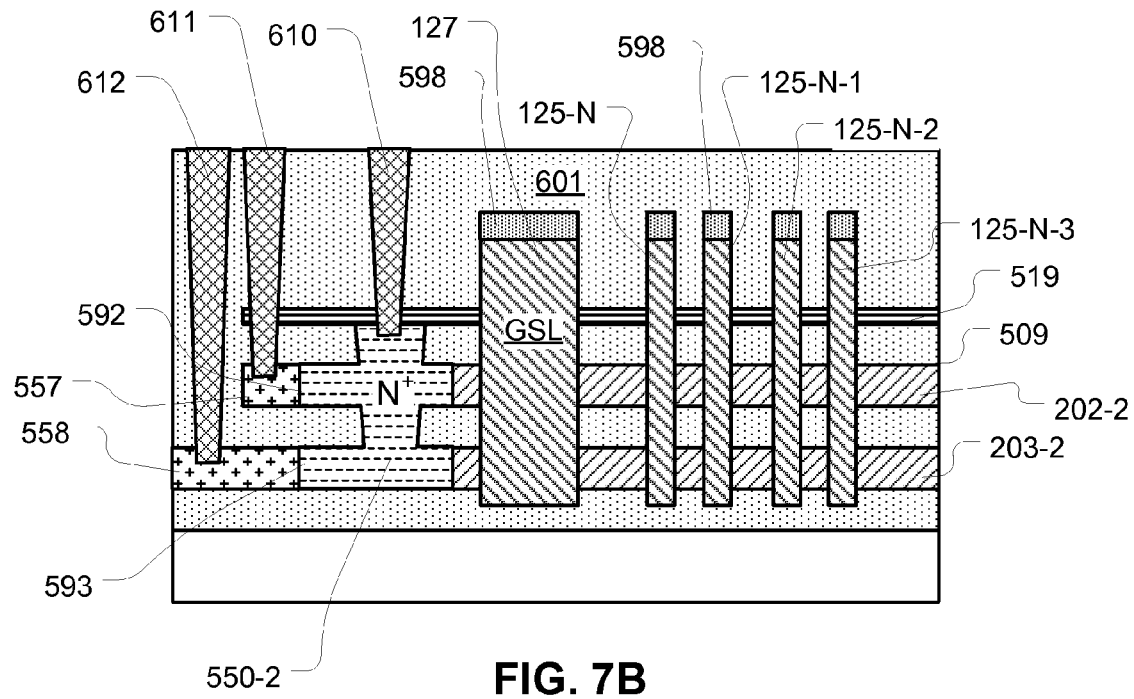

FIG. 7B illustrates the results of filling the openings with interlayer conductor material to form interlayer conductors 610, 611, 612, such as tungsten plugs or other conductive structures, and planarizing the resulting stack to make ready a surface for forming an overlying patterned conductor layer or layers.

As shown in FIG. 7B, the carrier source structure includes the diodes comprised of the N+ region 550-2, and corresponding N+ region on each of the active strips, along with the P+ regions 557, 558 in the supply line contact pads, which establish PN junctions 592, 593. Also, the carrier source structure includes the interlayer conductors 610, 611, 612. These interlayer conductors provide for contact to overlying first and second supply lines as discussed in more detail below.

FIGS. 8, 8A, 8B, 9, 9A, 9B illustrate stages in a manufacturing process which results in a carrier source structure like that shown in FIG. 2B. Starting with FIG. 8, the pattern of the etching after formation of alternating stacks of active material and insulating material is shown. In this etch, active strips 202-1, 202-2, 202-8 are formed that are connected on a first end to the bit line contact pads 202-A, 202-B, 202-C, 202-D. The active strips are connected on the second end to the supply line contact pad 220. In this example, openings 650-1 through 650-8 and 651-1 through 651-8 are formed in the supply line contact pad 220. In this example, there are two openings (e.g. 650-2, 651-2) aligned with each of the active strips (e.g. 202-2).

Figure 8:
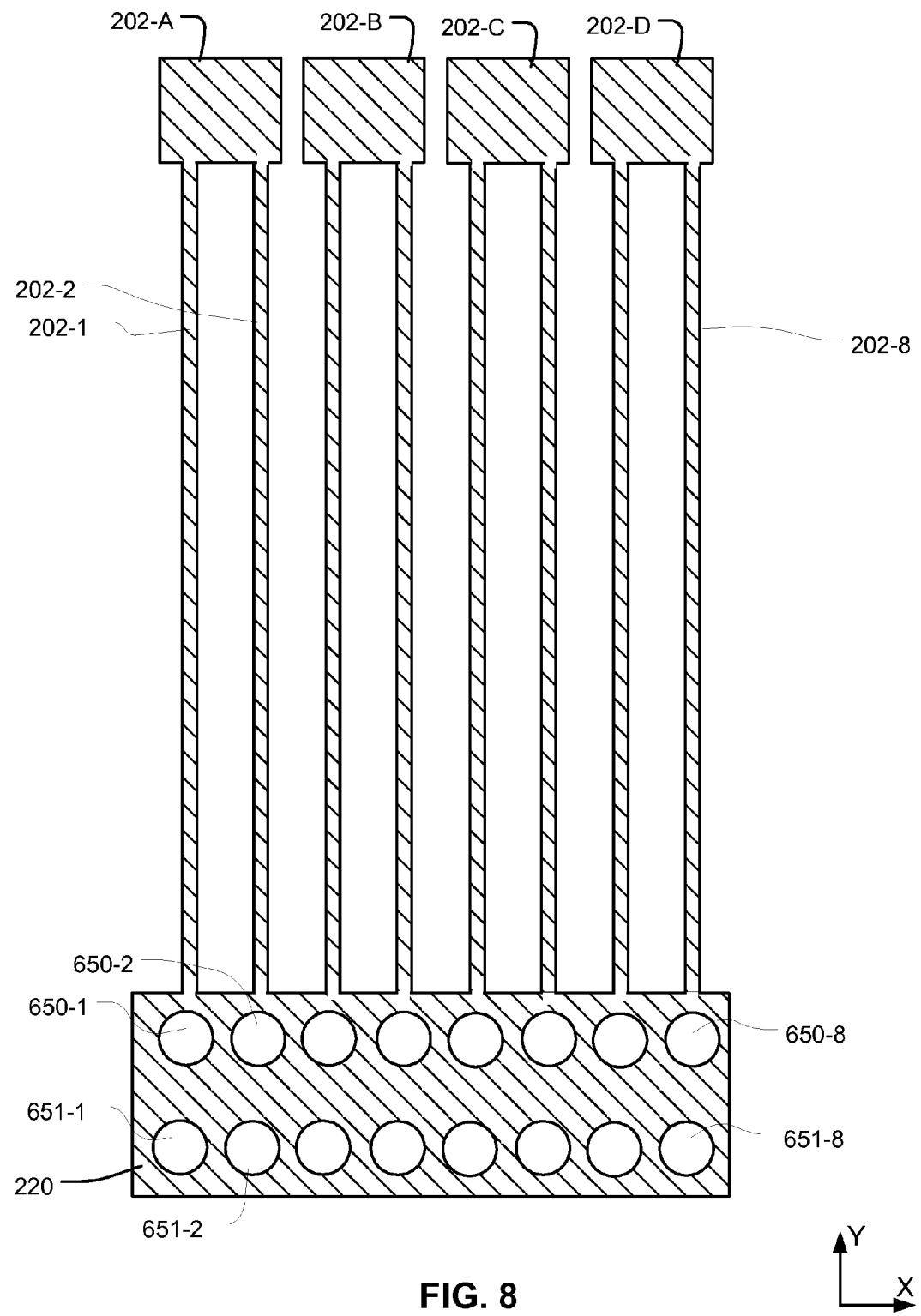
FIG. 8 is a layout view of an intermediate structure in the manufacturing process for a structure like that of FIG. 2 with an alternative diode structure like that of FIG. 2B.
Figure 8A:
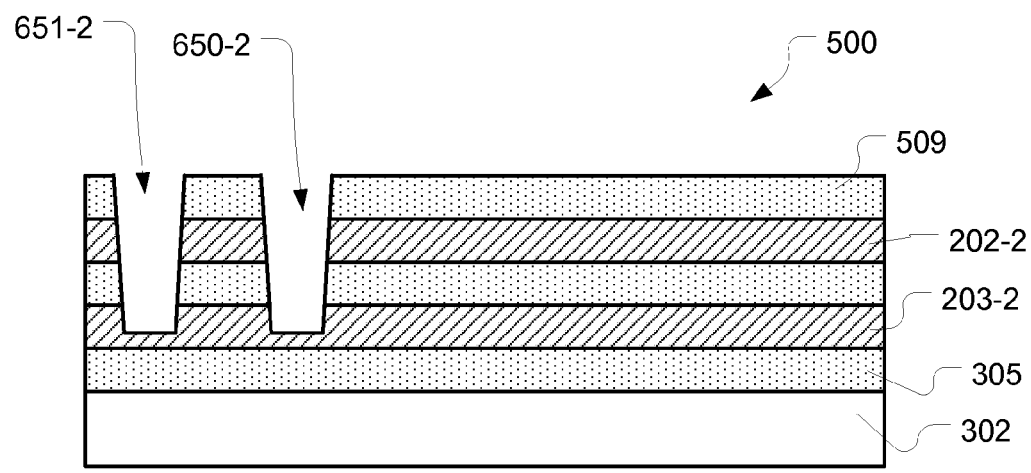
FIGS. 8A and 8B are cross-sectional views illustrating additional stages in the manufacturing process based on the layout view of FIG. 8.

FIG. 8A illustrates formation of openings 650-2, 651-2 along the strip 202-2, in the region of the bit line contact pad, and extending to the layer of the lower strip 203-2.

Figure 8B:
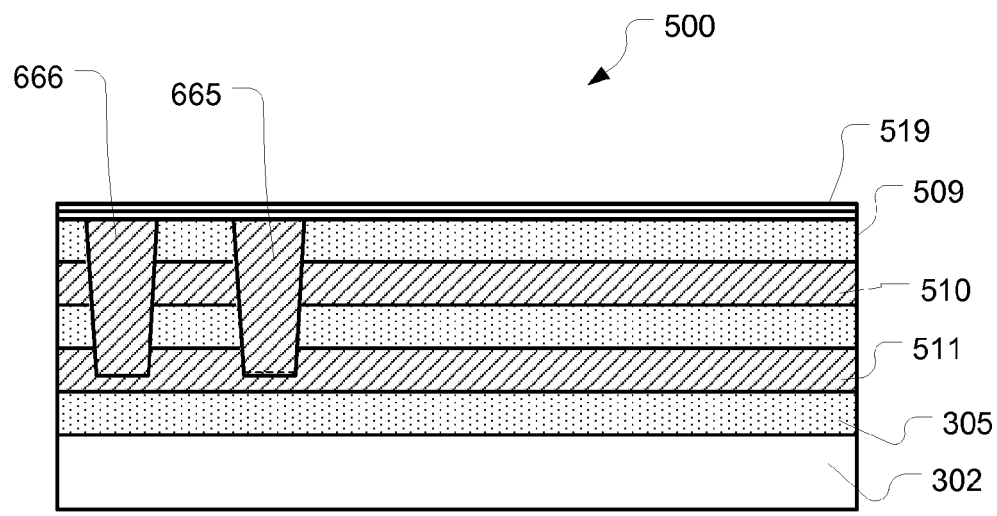

FIG. 8B illustrates that the openings 650-2, 651-2 are filled with a semiconductor material, forming columns 665 and 666 making contract with the strips in the layers 510 and 511. The surface can be planarized and then a charge storage structure layer 519 can be formed over the stacks of active strips.

Figure 9:
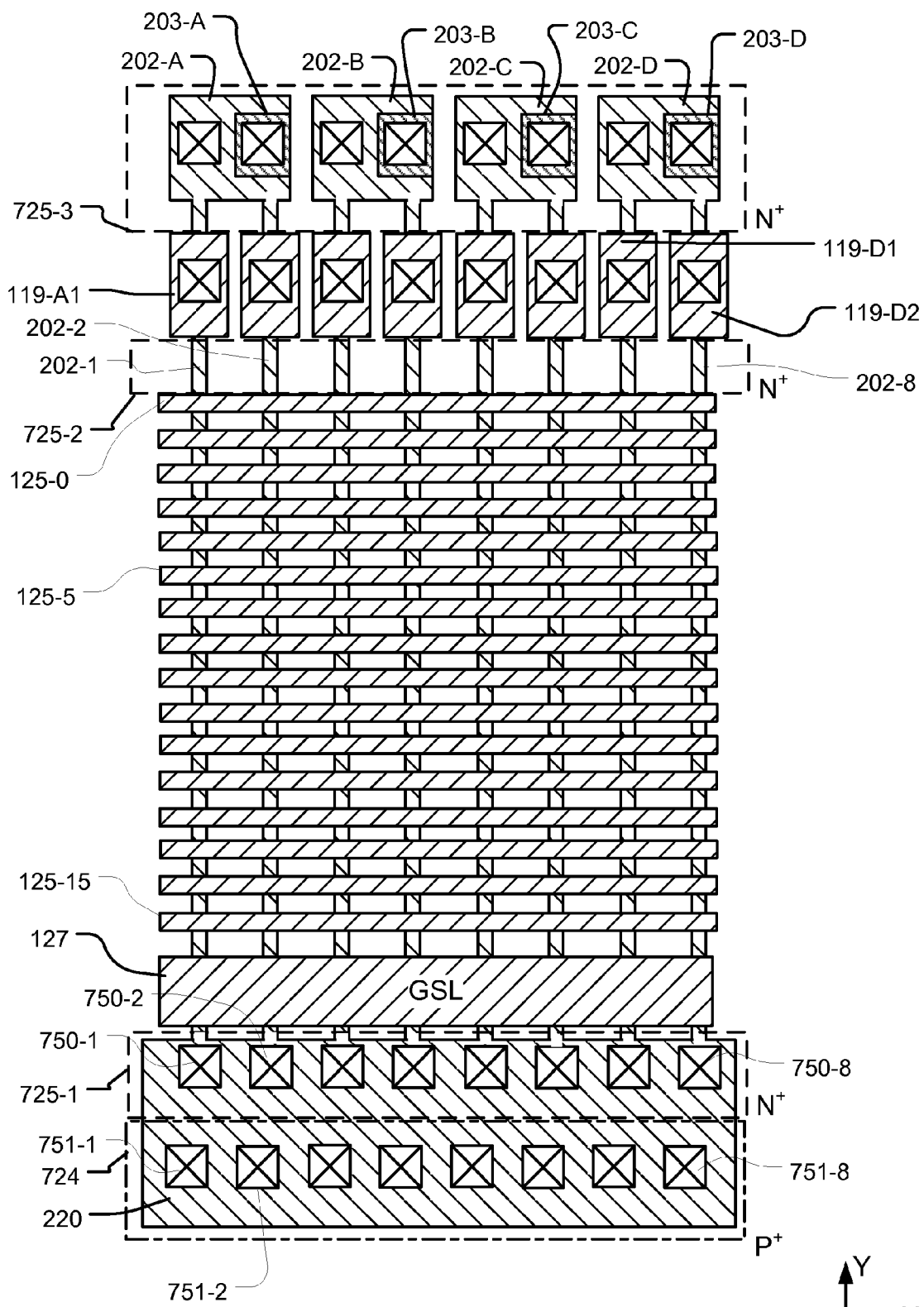
FIG. 9 is a layout view of another intermediate structure in the manufacturing process after the stage illustrated in FIG. 8, for a structure like that of FIG. 2.

FIG. 9 is a plan view showing the results of many of the steps described above in connection with the first manufacturing sequence. Thus, this plan view shows the stairstep contacts in the region of the bit line contact pads, contacts over the strings select structures, and two sets of contacts (750-1 to 750-8 and 751-1 to 751-8). Contacts 750-1 to 750-8 connect to the columns such as are formed with reference to FIGS. 8A and 8B, in the region of the supply line contact pad 220. Also shown in the plan view of FIG. 9 are the N+ implant region 725-1 which overlies the portion of the supply line contact pad adjacent the GSL line 127, the N+ implant region 725-2 which lies between the string selection structures in the first word line, and the N+ implant regions 725-3 which overlies the bit line contact pad region. FIG. 9 also illustrates the P+ implant region which overlies the supply line contact pad 220 in the region distal from the active strips.

Figure 9A:
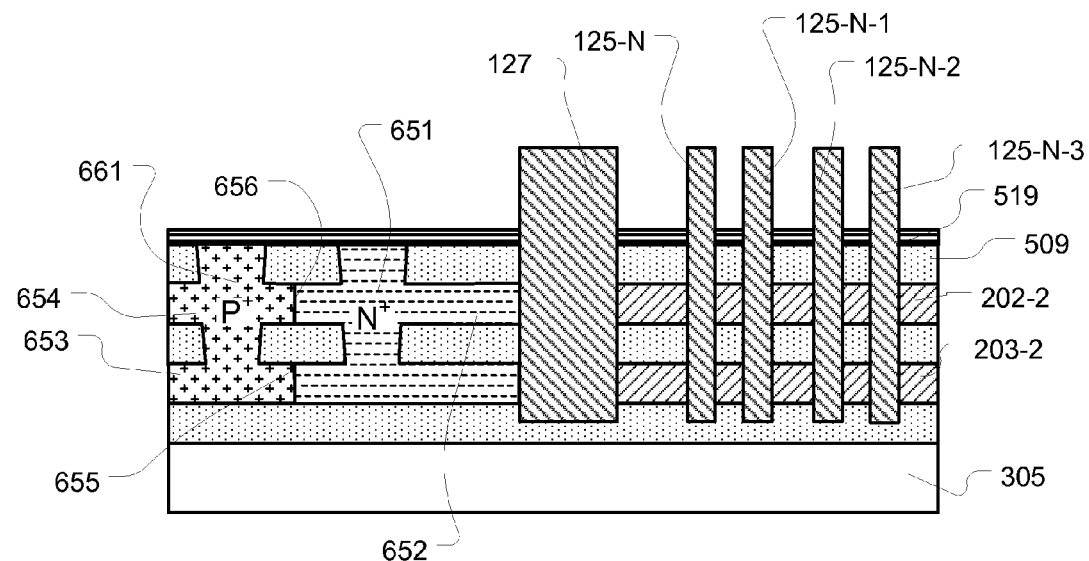
FIGS. 9A and 9B are cross-sectional views illustrating additional stages in the manufacturing process based on the layout view of FIG. 9.

FIG. 9A shows the results of the implant in the region near the supply line contact pads, forming the N+ pillar 651 and N+ portions (e.g. 652) of the supply line contact pads in the upper and lower layers, which result from the implant in region 725-1, and the P+ pillar 661 and P+ portions 653, 654 of the supply line contact pads in the upper and lower layers, which result from the implant in the region 724. PN junctions 656, 655 are thereby formed in the structure.

Figure 9B:
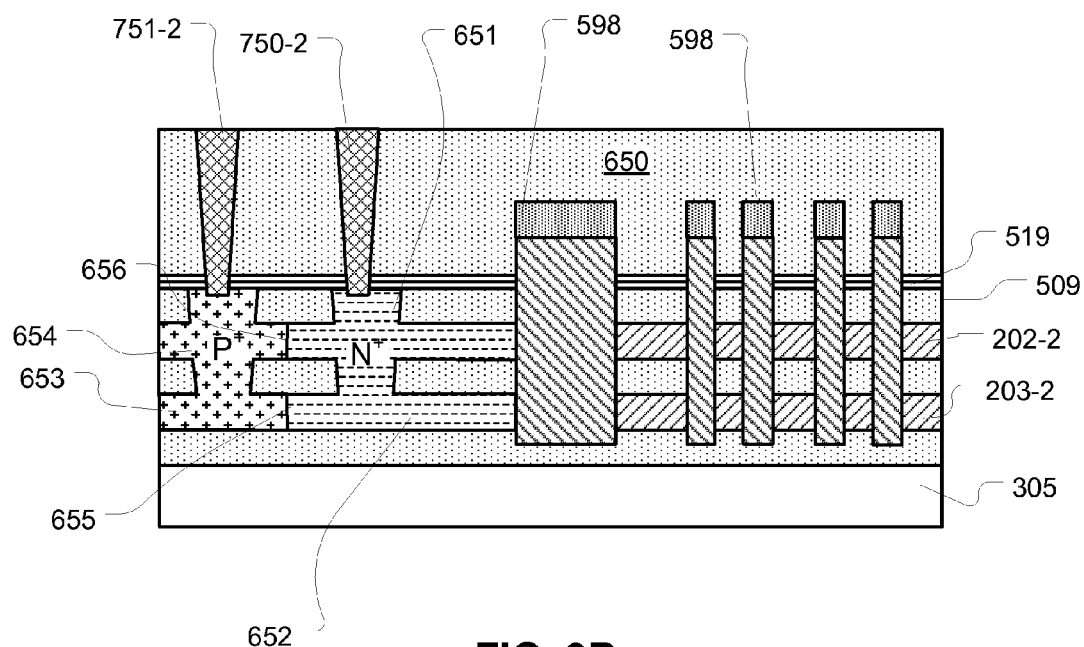

FIG. 9B shows the results of the process for forming the silicide layer 598, forming interlayer dielectric fill 650, and forming interlayer connectors 751-2, 750-2 on the structure. As can be seen, a carrier source structure like that shown in FIG. 2B results from the sequence.

FIGS. 10, 10A, 10B, 11, 11A and 11B illustrate stages in a manufacturing process which results in a carrier source structure like that shown in FIG. 2C. Starting with FIG. 10, the pattern of the first etch after formation of alternating stacks of active material and insulating material is shown. In this etch, active strips 202-1, 202-2, 202-8 are formed that are connected on a first end to the bit line contact pads 202-A, 202-B, 202-C, 202-D. The active strips are connected on the second end to the supply line contact pad 220. In this example, the upper supply line contact pad 220 is etched to reveal a portion of the semiconductor substrate. Also openings 850-1 through 850-8 are formed through the upper supply line contact pad down to the level of the lower supply line contact pad. This plan view also shows the region 824 of P+ implant which is used to form a P+ region 351 in the substrate 302.

Figure 10:
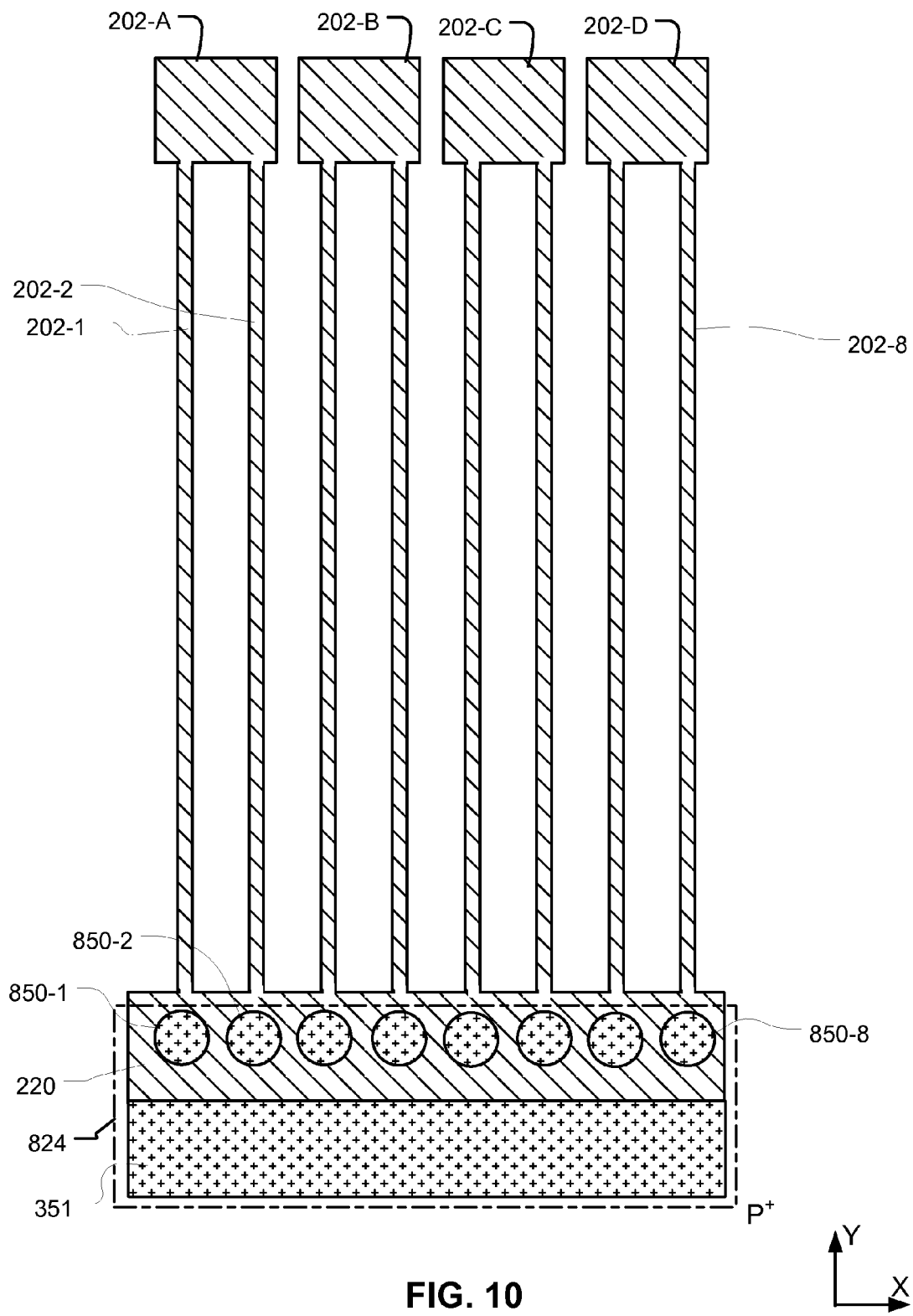
FIG. 10 is a layout view of an intermediate structure in the manufacturing process for a structure like that of FIG. 2 with a diode structure like that of FIG. 2C.
Figure 10A:
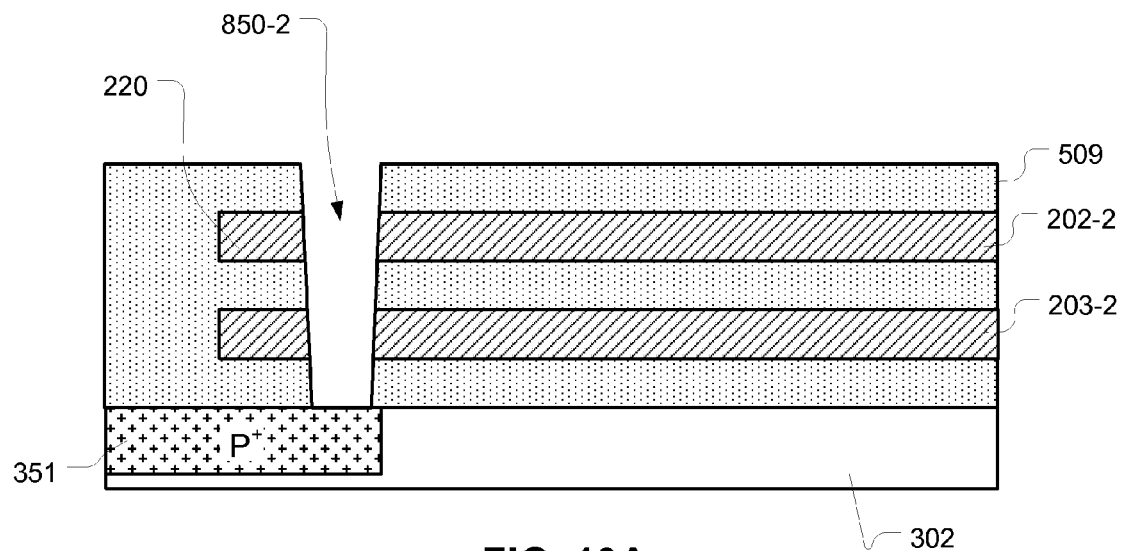
FIGS. 10A and 10B are cross-sectional views illustrating additional stages in the manufacturing process based on the layout view of FIG. 10.

FIG. 10A is a side view along the active strips 202-2, 203-2, showing opening 850-2 which extends through the stack to the P+ region 351 in the substrate 302.

Figure 10B:
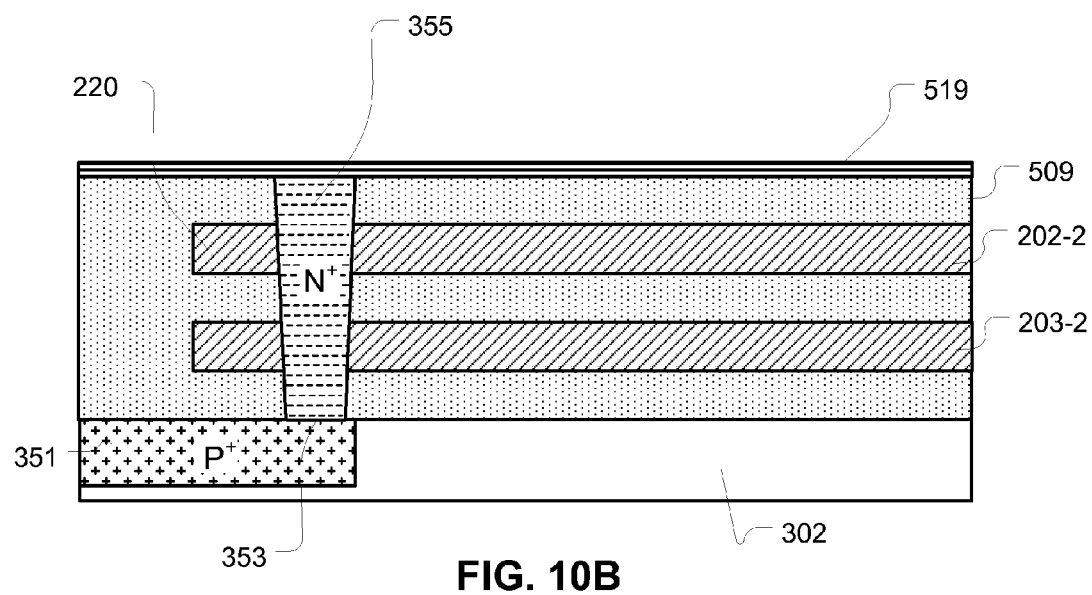

FIG. 10B is a side view after formation of an N+ pillar (column 355) of semiconductor material which extends through the supply line contact pad 220 coupled to the active strips. At the interface 390 between the N+ pillar (column 355) and the P+ region 351 in the substrate, a PN junction is formed, establishing a diode for the carrier source structure. Also shown in FIG. 10B, are the results of formation of the charge storage structure layer 519 over patterned active strips.

Figure 11:
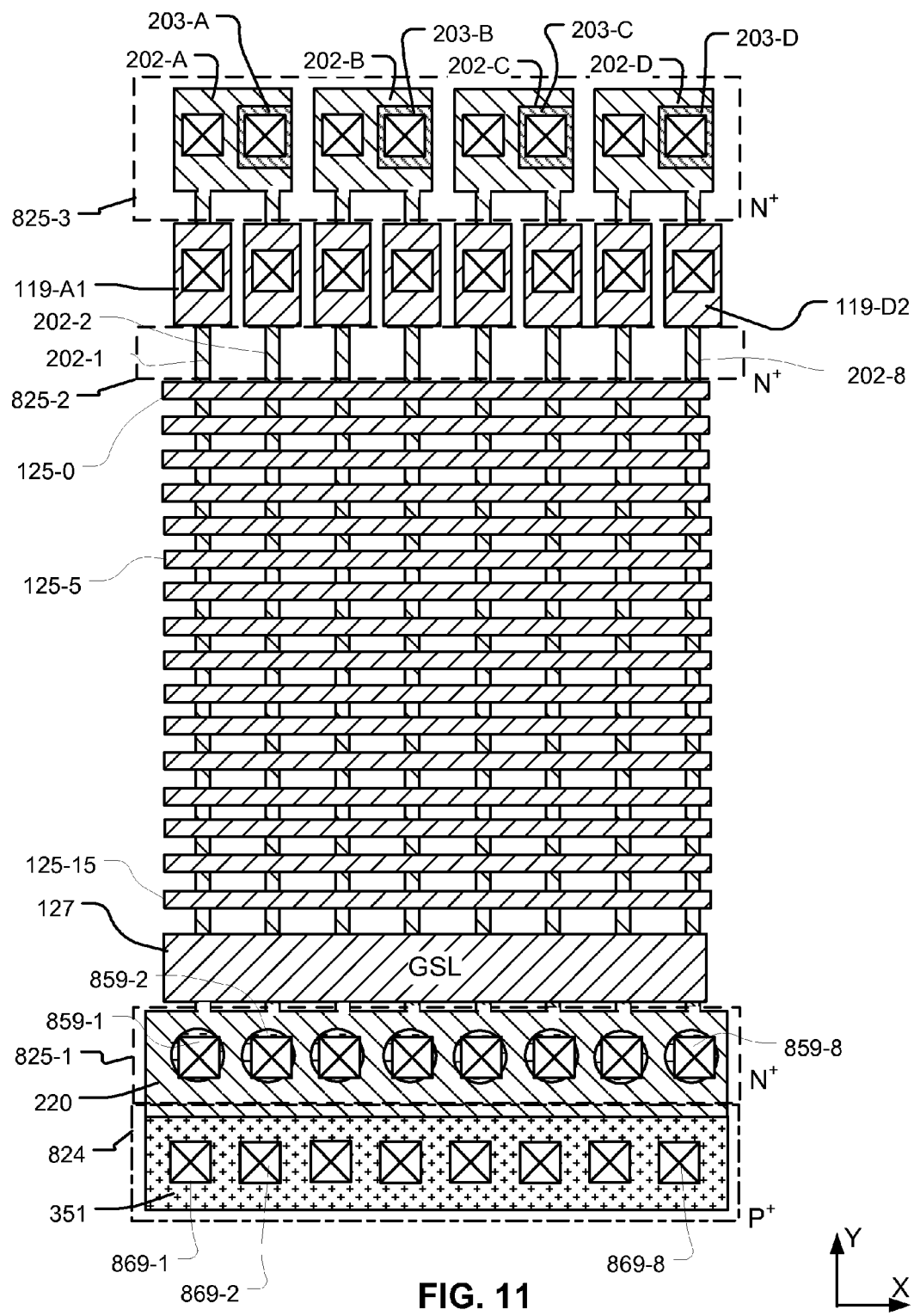
FIG. 11 is a layout view of another intermediate structure in the manufacturing process for a structure like that of FIG. 2, after that of FIG. 10.

FIG. 11 is a plan view showing results of many of the steps described above in connection with the first manufacturing sequence. Thus, this plan view shows the stairstep contacts in the region of the bit line contact pads, contacts over the string select structures, a set of interlayer conductors (859-1, 859-2, 859-8) formed in the manner described with reference to FIGS. 10A and 10B in the region of the supply line contact pad 220, and a set of interlayer conductors (869-1, 869-2, 869-8) for connection to the P+ region 351 in the substrate. FIG. 11 also shows the region 824 of P+ implant, and the N+ implant region 825-1 over the supply line contact pad 220, the N+ implant region 825-2 between the string select structures and the first word line, and the N+ implant region 825-3 over the bit line contact pads.

Figure 11A:
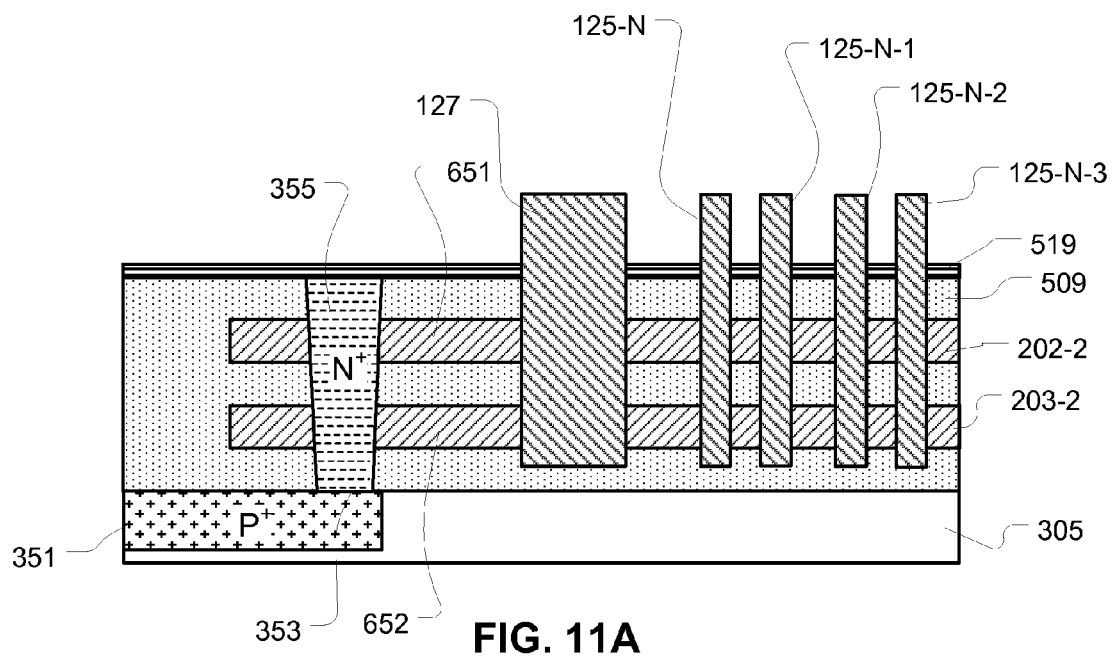
FIGS. 11A and 11B are cross-sectional views illustrating additional stages in the manufacturing process based on the layout view of FIG. 11.

FIG. 11A is a side view like that of FIG. 6C, which shows the results of forming the charge storage layer 519, and the horizontal word lines (e.g. 125-0, 125-5, 125-15) and the horizontal ground select line GSL 127 overlying the active strips.

Figure 11B:
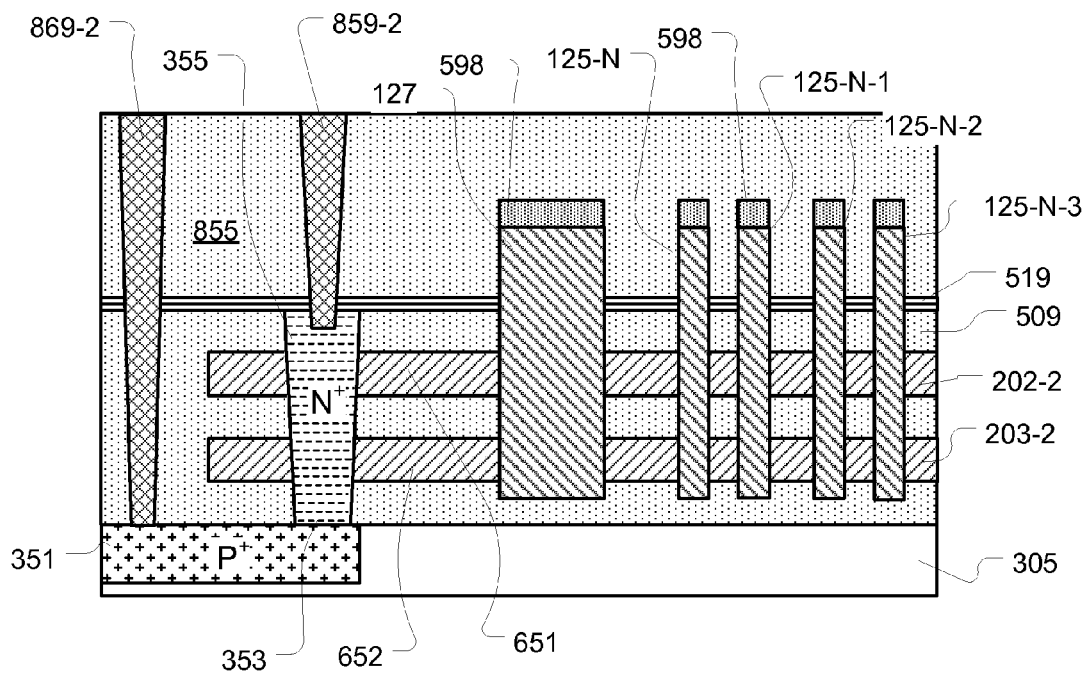

FIG. 11B illustrates a result of formation of the silicide 598, formation of insulating fill 855, and formation of interlayer conductors 859-2 which connects the N+ pillar (column 355), and interlayer conductor 869-2 which connects to the P+ region 351 in the substrate 302. As can be seen, a PN junction 353 is formed establishing a diode for the carrier source structure.

FIGS. 12 to 15 are schematic diagrams for a two-layer 3D array of one of the blocks, e.g. block A, in the structure shown in FIG. 2, which can have any of the carrier source structures of FIGS. 2A-2C. Although standard transistor symbols are used, embodiments described herein comprise junction-free NAND strings.

For clarity purposes, the term "program" as used herein refers to an operation which increases the threshold voltage of a memory cell. The data stored in a programmed memory cell can be represented as a logical "0" or logical "1." The term "erase" as used herein refers to an operation which decreases the threshold voltage of a memory cell. The data stored in an erased memory cell can be represented as the inverse of the programmed state, as a logical "1" or a logical "0." Also, multibit cells can be programmed to a variety of threshold levels, and erased to a single lowest threshold level or highest threshold level, as suits a designer. Further, the term "write" as used herein describes an operation which changes the threshold voltage of a memory cell, and is intended to encompass both program and erase, or a combination of program and erase operations.

A program operation described herein includes biasing selected memory cells to inject electrons into the charge storage structure of a selected memory cell, thereby increasing the threshold voltage. A program operation can be applied to program one or more selected memory cells in a page, in a word or in a byte for example. During the program operation, unselected memory cells are biased to prevent or reduce disturbance of stored charge.

A block erase operation described herein for an n-channel memory, includes biasing a block of cells to inject holes into the charge storage structures of cells in the selected block, thereby reducing the threshold voltages, at least in cells of the block that do not already have a low threshold voltage. Other program and erase biasing operations may be utilized.

As shown in FIG. 12, the block includes four NAND strings, including two strings connected to the level one bit line BLL1 and two strings coupled to the level two bit line BLL2. The string select structure for a first one of the stacks of active strips includes string select switches 824-1 and 824-2 which are connected to a string select line SSL1. Likewise, the string select structures for a second one of the stacks of active strips includes string select switches 825-1 and 825-2 which are connected to a string select line SSL2. The ground select line GSL overlies the active strips, forming four ground select switches 814-1, 814-2, 814-3, 814-4. Also, the active strips are coupled to an N-type terminal 801 of a PN diode, which in turn is coupled by contacts 804-1, 804-2, 804-3, 804-4 to a first supply line 803. The P-type terminal 800 of the PN diode is coupled to a second supply line 802. The same circuit configuration is illustrated in each of FIGS. 12-15.

Figure 13:
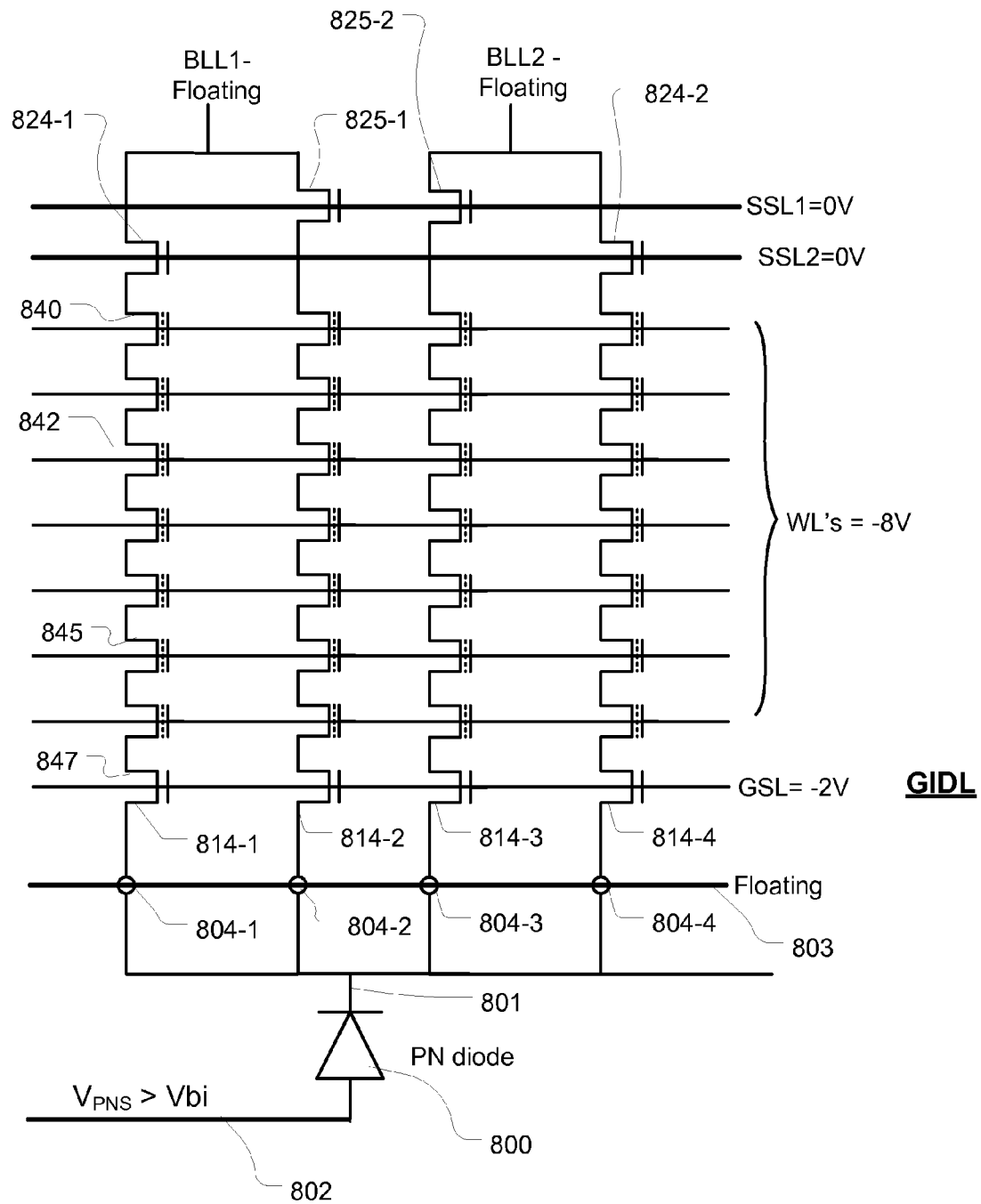
FIG. 13 is a schematic diagram of a 3D NAND like that of FIG. 2, showing a bias arrangement for an erase operation.
Figure 14:
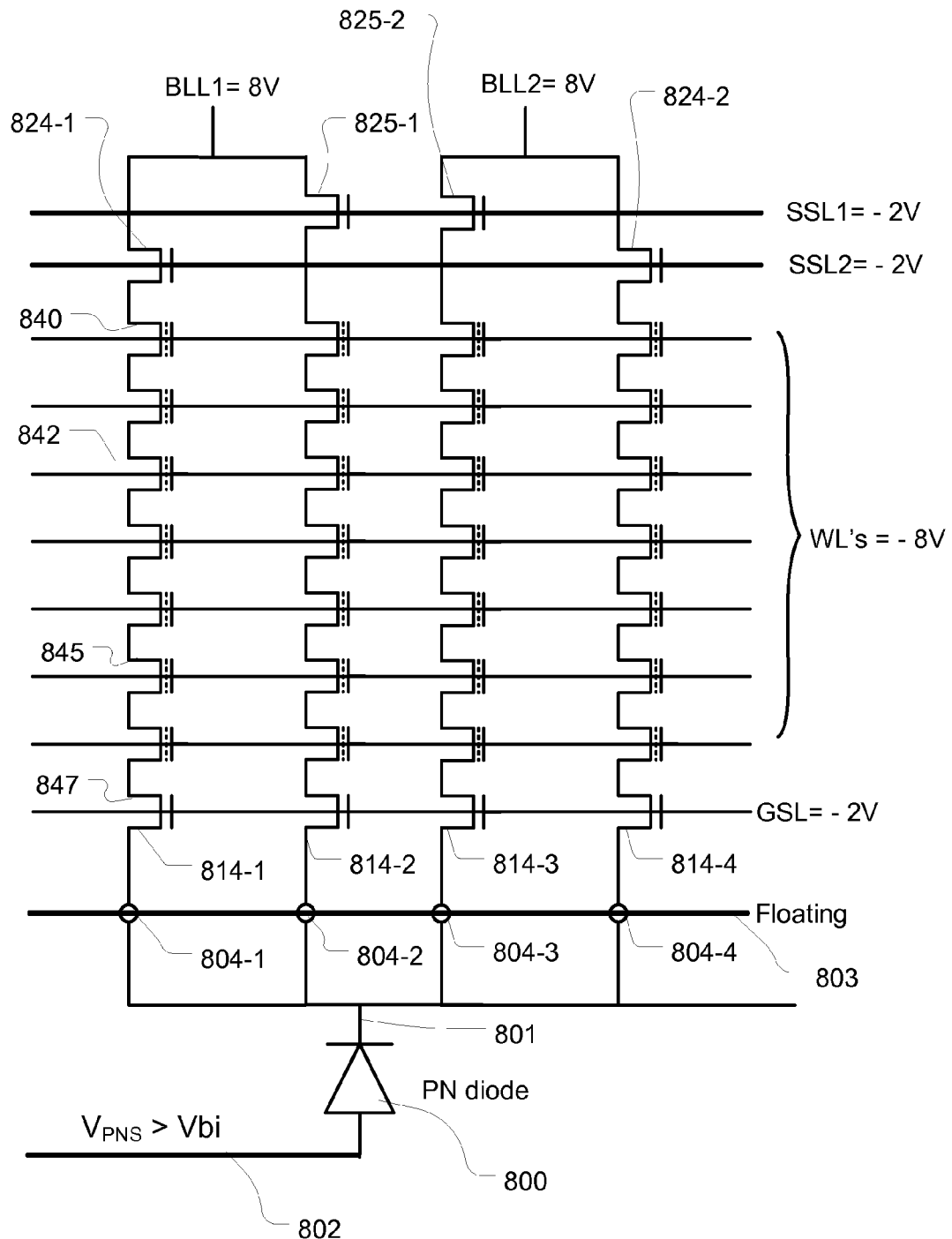
FIG. 14 is a schematic diagram of a 3D NAND like that of FIG. 2, showing an alternative erase bias arrangement.
Figure 15:
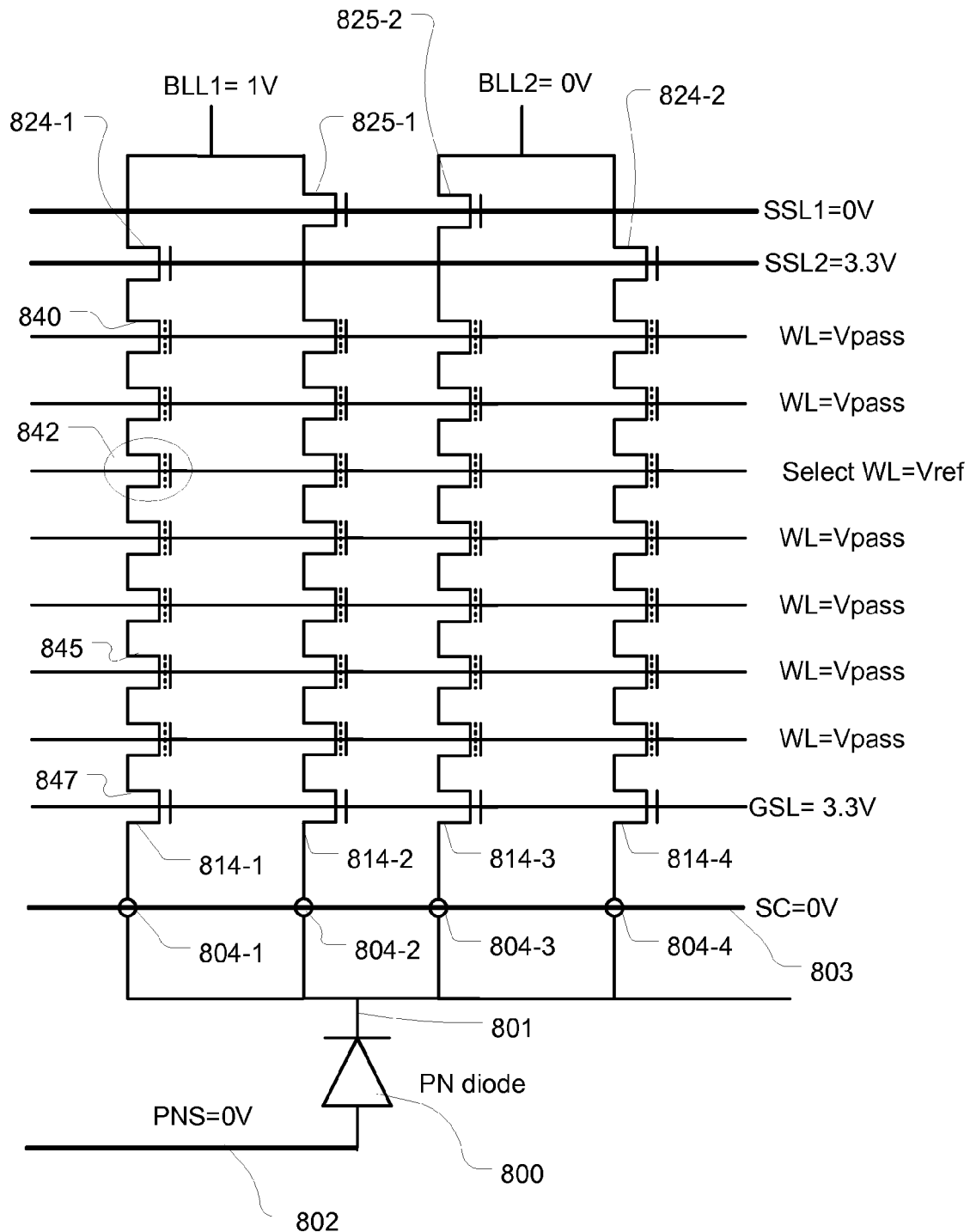
FIG. 15 is a schematic diagram of a 3D NAND like that of FIG. 2, showing a read bias arrangement.

In FIG. 12, a biasing arrangement for programming a selected cell is illustrated. In FIG. 13, a biasing arrangement for erasing the block of memory cells is illustrated. In FIG. 14, an alternative biasing arrangement for erasing the block of memory cells is illustrated. In FIG. 15, a biasing arrangement for reading a selected cell in the block is illustrated.

Thus, the memory circuit includes a series arrangement of a plurality of memory cells, such as the string including memory cells 840, 842, 845, 847. The series arrangement is coupled on a first end by a first switch (e.g. 824-1) to a bit line BLL1. Series arrangement is coupled on a second end by a second switch (e.g. 814-1) to a first terminal 801 of the diode. The memory circuit also includes a plurality of word lines WL. Circuitry is coupled to the plurality of word lines, to the first and second supply lines, to the GSL line, to the SSL lines and to the bit lines for controlling operation of the memory circuit. In this structure, the circuitry is configured to drive, or to bias, the first and second supply lines with different bias conditions. Also, the controller can include circuitry configured to apply an erase bias arrangement that induces hole tunneling, a program bias arrangement, and a read bias arrangement. The controller is described below with reference to FIG. 17.

FIG. 12 shows a program bias arrangement that induces electron tunneling. In this bias arrangement, a source side bias is applied to the first supply line 803 (e.g. SC=0 V), while the second supply line 802 receives a bias which reverse biases the diode, or leaves the second supply line 802 floating, so that the diode is turned off and no current passes to the second supply line 802.

In FIG. 12, the program bias arrangement can be understood with reference to the illustrated example as follows:
Select BL: 0V
Unselect BL: 3.3V
Select SSL: 3.3V
Unselect SLL: 0V
Select WL: Vpgm
Unselect WL: Vpass
GSL: 0V
SC: 0V
PNS source side: 0V (PN diode turn off)

This program bias arrangement can represent a program pulse in a programming operation, such as an incremental step pulsed programming ISPP process, for more conventional flash memory array, where the additional source of carriers is not needed, and the diode is turned off.

FIG. 13 shows an erase bias arrangement that induces hole tunneling. The erase bias arrangement can be understood with reference to the illustrated example, as follows:
All BL: Floating
All SSL: 0V
All WL: −8V
GSL: −2V
SC: Floating
PNS source side: V>Vbi (PN diode turn on)

In this erase operation, the PN diode is turned on, and can provide a source of holes for the hole tunneling erase. Also, gate induced drain leakage GIDL in the GSL switches can contribute holes to the active strips.

FIG. 14 shows an alternative erase bias arrangement which takes advantage of GIDL at both the string select structures as well as the ground select structures. This erase bias arrangement can be understood with reference to the illustrated example as follows:
All BL: 5-8V
All SSL: −2V
All WL: −8V
GSL: −2V
SC: Floating
PNS source side: V>Vbi (PN diode turn on)

In this erase bias arrangement, the diode is on, holding the source contact at a reference voltage, while the first supply line is left floating, so that the first supply line is not involved in the biasing. The string select switches receive a negative gate voltage suitable for inducing formation of holes as result of gate induced drain leakage. The selected memory cell is biased for −FN hole tunneling.

FIG. 15 illustrates a read bias arrangement. In this read bias arrangement, the diode is turned off as well, allowing operation according to more typical read processes. The read bias arrangement can be understood with respect to the illustrated example as follows:
Select BL: 1V
Unselect BL: 0V
Select SSL: 3.3V
Unselect SLL: 0V
Select WL: Vref
Unselect WL: Vpass
GSL: 3.3V
SC: 0V
PNS source side: 0V (PN diode turn off)

The diode is biased during read so that there is no voltage drop across the diode, preserving overhead in the bias voltages for high-speed and efficient read.

Figure 16:
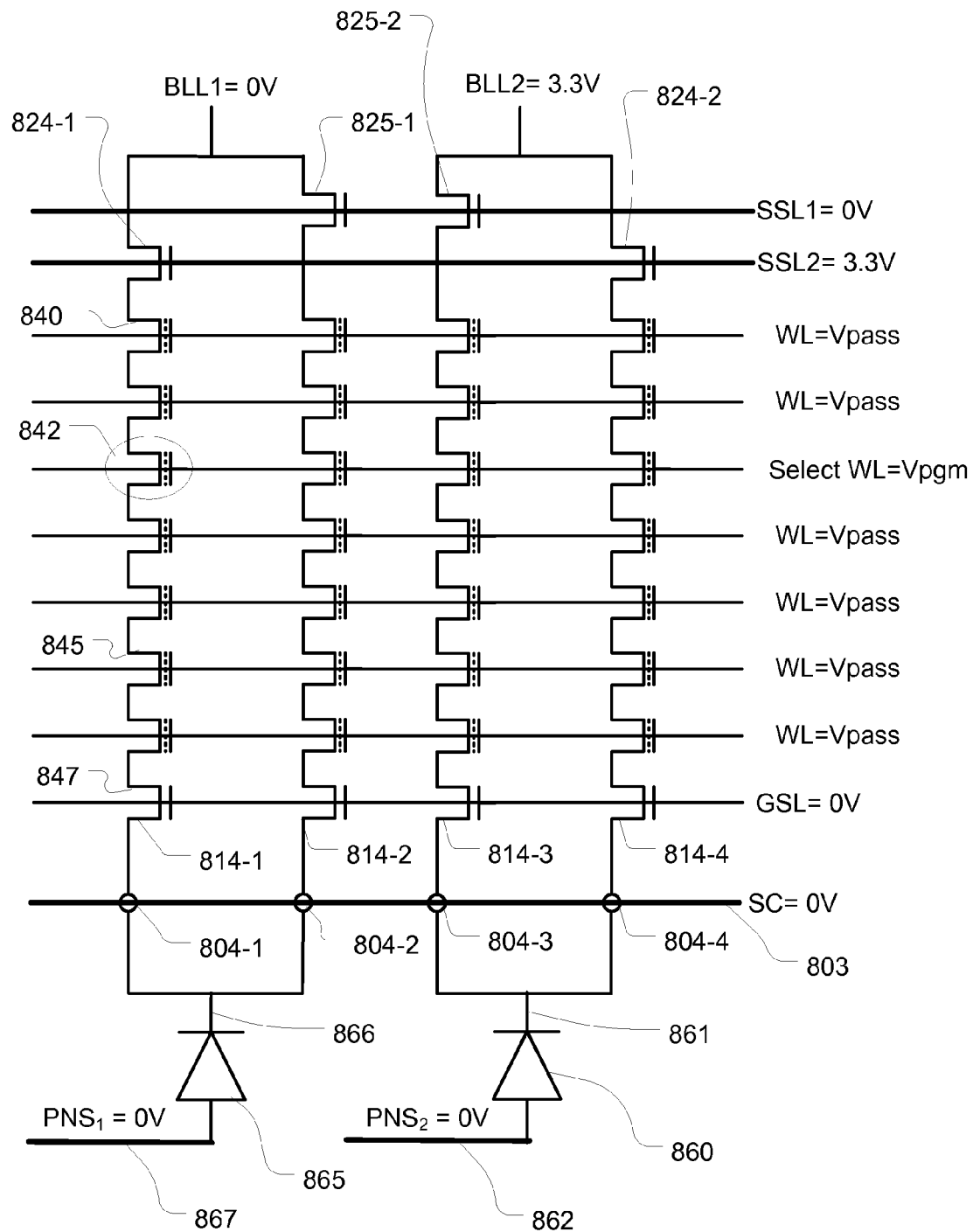
FIG. 16 is a schematic diagram of an alternative 3D NAND structure, showing an example of a circuit having one diode for every stack of active strips, biased for a programming operation.

FIG. 16 is a schematic diagram of an alternative circuit, representative of a variety of alternative configurations which can be implemented. In this configuration, each level has a separate carrier source diode. Thus the level coupled to BLL1 has a diode including a first terminal 866 and a second terminal 865. The level coupled to BLL2 has a diode including a first terminal 861 in a second terminal 860. Individual second supply lines 862 and 867 are connected to the second terminals of the diodes. The biasing arrangements applied to the circuit of FIG. 16 can be like those discussed above, with reference to FIGS. 12-15.

Figure 17:
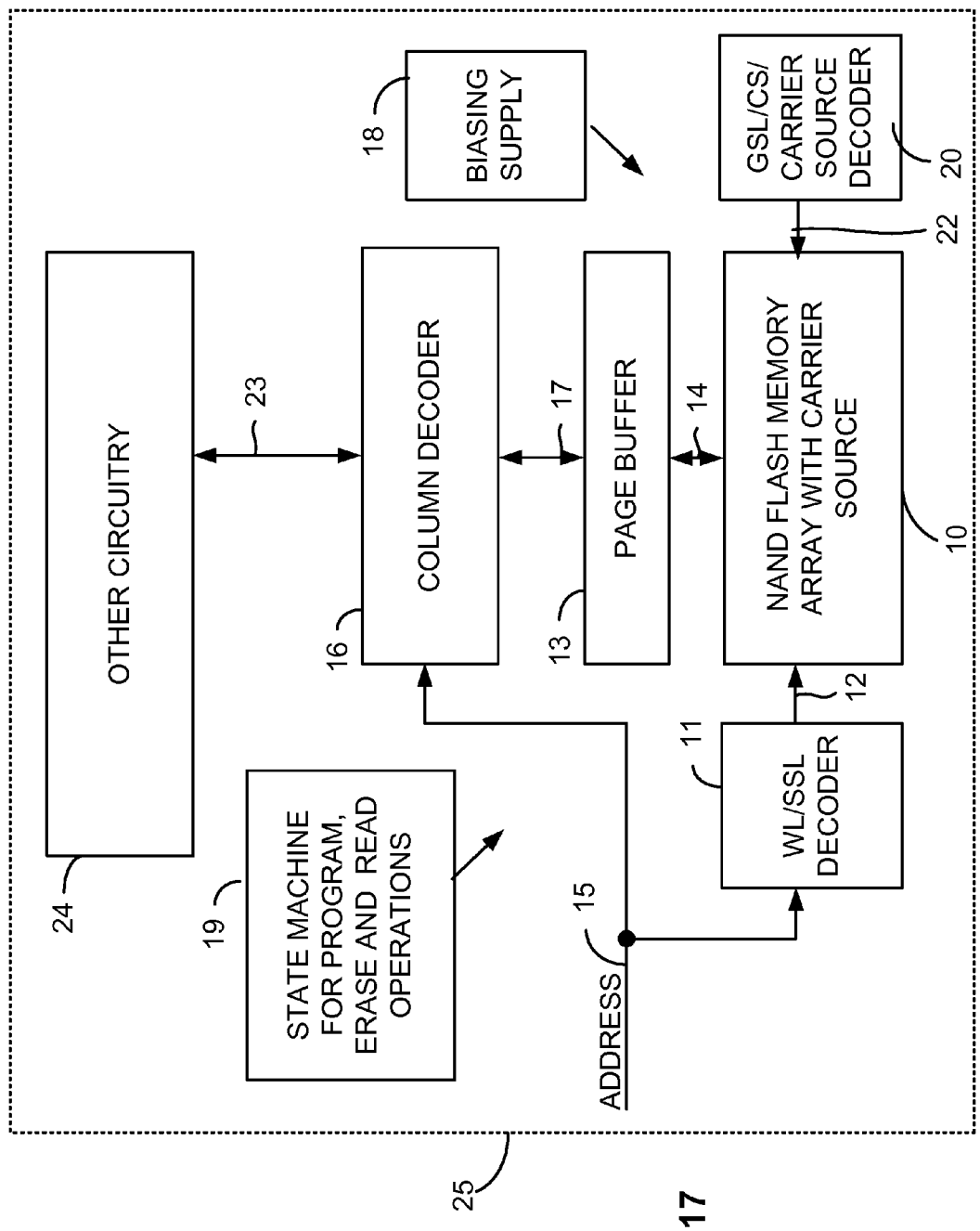
FIG. 17 is a simplified block diagram of an integrated circuit including a 3D memory including a carrier source circuit as described herein.

FIG. 17 is a simplified block diagram of an integrated circuit 25 including a p-channel, NAND flash memory array 10 which can be operated as described herein. In some embodiments, the array 10 is a 3D memory and includes multiple levels of cells. A row decoder 11 is coupled to a plurality of word lines 12 arranged along rows in the memory array 10. Column decoders in block 16 are coupled to a set of page buffers 13, in this example via data bus 17. The global bit lines 14 are coupled to local bit lines (not shown) arranged along columns in the memory array 10. Addresses are supplied on bus 15 to column decoder (block 16) and row decoder (block 11). In addition, as logically represented by block 20, the circuitry includes drivers for the sets of first and second supply lines 22 so that they can be separately or independently biased.

Data is supplied via the data-in line 23 from other circuitry 24 (including for example input/output ports) on the integrated circuit, such as a general purpose processor or special purpose application circuitry, or a combination of modules providing system-on-a-chip functionality supported by the array 10. Data is supplied via the data-in line 23 to input/output ports or to other data destinations internal or external to the integrated circuit 25.

A controller, implemented in this example as a state machine 19, provides signals to control the application of bias arrangement supply voltages generated or provided through the voltage supply or supplies in block 18 to carry out the various operations described herein, including operations to read and write data in the array. These operations include erase, program and read. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

The controller can comprise circuitry that executes a process including biasing the diode in a forward bias condition to provide minority carriers to the series arrangement during operations to change a threshold of a memory cell or cells in the memory, and biasing the diode in a reverse bias condition during read operations. For example, the process executed by the circuitry in the controller can include biasing the diode in a forward bias condition during erase operations. Also, the process executed by the circuitry in the controller can include biasing the diode in a reverse bias condition during program operations.

A structure is described which can lead to improved erase performance in 3D memory, that includes an additional PN diode source on the source side of NAND strings in the array.

In one embodiment, the carrier source structure is disposed in a vertical gate (VG) NAND flash. In operation, hole tunneling erase in a 3D vertical gate memory can be much different from the conventional NAND due to the thin film transistor (TFT) structure and lack of a body contact. A hole source in this case can result in improvement of the device erase.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the technology and the scope of the following claims.

What is claimed is:

1. A memory comprising:
    a diode having first and second terminals;
    a series arrangement including a plurality of memory cells, the series arrangement coupled on a first end by a first switch to a bit line and coupled on a second end by a second switch to the first terminal of the diode;
    first and second supply lines connected to the first and second terminals, respectively, of the diode;
    a plurality of word lines, word lines in the plurality coupled to corresponding memory cells in the plurality of memory cells; and
    circuitry coupled to the plurality of word lines and to the first and second supply lines configured to bias the first and second supply lines with different bias conditions.

2. The memory of claim 1, wherein the circuitry is configured to apply an erase bias arrangement that induces hole tunneling, the erase bias arrangement including a source side bias on the second supply line which forward biases the diode, while the first supply line remains floating, and erase voltages on the plurality of word lines that induce hole tunneling.

3. The memory of claim 1, wherein the circuitry is configured to apply a program bias arrangement that induces electron tunneling, the program bias arrangement including a source side bias on the first supply line, while the second supply line remains floating or is biased to reverse bias the diode, and voltages on the plurality of word lines that induce electron tunneling.

4. The memory of claim 1, wherein the plurality of memory cells comprises thin film transistor cells.

5. The memory of claim 1, wherein the plurality of memory cells comprises thin film transistor cells arranged on a single semiconductor strip, and said first terminal of the diode includes a doped region in the strip.

6. The memory of claim 1, wherein the plurality of memory cells comprises thin film transistor cells arranged on a single semiconductor strip, and said first and second terminals of the diode include respective doped regions in the strip.

7. The memory of claim 1, wherein the plurality of memory cells comprises thin film transistor cells arranged on a single semiconductor strip which overlies a semiconductor substrate, and said first terminal of the diode includes doped semiconductor material coupled to the strip and to the semiconductor substrate, and the second terminal of the diode includes a doped region in the semiconductor substrate.

8. The memory of claim 1, wherein the series arrangement is a NAND string, the memory including at least one additional NAND string coupled to the first terminal of the diode.

9. The memory of claim 1, wherein the plurality of memory cells is configured for an n-channel operation in a read mode, and the first terminal of the diode has n-type doping and the second terminal of the diode has p-type doping.

10. The memory of claim 1, wherein the plurality of memory cells is configured for a p-channel operation in a read mode, and the first terminal of the diode has p-type doping and the second terminal of the diode has n-type doping.

11. The memory of claim 1, wherein the plurality of memory cells comprises thin film, vertical gate cells.

12. The memory of claim 1, wherein the first diode terminals and the second diode terminal include doped regions in the plurality of strips.

13. A memory comprising:
a 3D array including a plurality of levels, each level including a pad and a plurality of strips of semiconductor material extending from the pad;
a plurality of first diode terminals, a first diode terminal in the plurality contacting one or more strips on an end distal of the pads in the plurality of levels;
a second diode terminal, the second diode terminal contacting the first diode terminals in the plurality of first diode terminals;
a first supply line connected to the plurality of first diode terminals;
a second supply line connected to the second diode terminal;
a plurality of word lines coupled to the plurality of strips in the plurality of levels;
charge-trapping, data storage elements between the word lines in the plurality of word lines and the strips of semiconductor material, whereby memory cells are disposed at cross-points of the strips and the word lines; and
circuitry coupled to the first and second supply lines configured to bias the first and second supply lines with different bias conditions.

14. The memory of claim 13, wherein the circuitry is configured to apply an erase bias arrangement that induces hole tunneling, the erase bias arrangement including a source side bias on the second supply line which forward biases the diode, while the first supply line remains floating, and erase voltages on the plurality of word lines that induce hole tunneling.

15. The memory of claim 13, wherein the circuitry is configured to apply a program bias arrangement that induces electron tunneling, the program bias arrangement including a source side bias on the first supply line, while the second supply line remains floating or is biased to reverse bias the diode, and program voltages on the plurality of word lines that induce electron tunneling.

16. The memory of claim 12, including a plurality of first select lines coupled to respective stacks of strips in the plurality of strips proximal to the pads, and a second select line overlying the plurality of strips between the first diode terminal and the plurality of word lines.

17. The memory of claim 13, wherein the first diode terminals include doped regions in the plurality of strips.

18. The memory of claim 13, wherein the plurality of levels overlie a semiconductor substrate, first diode terminals include doped semiconductor material coupled to the plurality of strips, and the second diode terminal includes a doped region in the semiconductor substrate.

19. The memory of claim 13, wherein the memory cell is configured for an n-channel operation in a read mode, and the first diode terminal comprises n-type semiconductor material and the second diode terminal comprises p-type semiconductor material.

20. The memory of claim 13, wherein the memory cells is configured for a p-channel operation in a read mode, and the first diode terminals comprise p-type semiconductor and the second diode terminal comprises n-type semiconductor.

21. The memory of claim 12, wherein the plurality of memory cells comprises thin film, vertical gate cells.

22. A method for operating a 3D flash memory that includes a series arrangement of memory cells coupled on a first end to a diode and on a second end to a bit line, comprising:
biasing the diode in a forward bias condition to provide minority carriers to the series arrangement during operations to change a threshold of a memory cell or cells in the memory, and biasing the diode in a reverse bias condition during read operations.

23. The method of claim 22, including biasing the diode in a forward bias condition during erase operations.

24. The method of claim 22, including biasing the diode in a reverse bias condition during program operations.

* * * * *